(12) United States Patent
Waki

(10) Patent No.: US 11,011,668 B2
(45) Date of Patent: May 18, 2021

(54) SEMICONDUCTOR DEVICE, SEMICONDUCTOR SYSTEM, AND METHOD OF CONTROLLING THE SEMICONDUCTOR DEVICE

(71) Applicant: Renesas Electronics Corporation, Tokyo (JP)

(72) Inventor: Tsuyoshi Waki, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 343 days.

(21) Appl. No.: 16/116,546

(22) Filed: Aug. 29, 2018

(65) Prior Publication Data
US 2019/0140131 A1   May 9, 2019

(30) Foreign Application Priority Data
Nov. 9, 2017   (JP) .............................. JP2017-216518

(51) Int. Cl.
*H01L 31/167* (2006.01)
*H01L 25/16* (2006.01)
(Continued)

(52) U.S. Cl.
CPC .......... *H01L 31/167* (2013.01); *H01L 25/167* (2013.01); *H03K 3/012* (2013.01);
(Continued)

(58) Field of Classification Search
CPC ..... H01L 31/167; H01L 31/16; H01L 25/167; H01L 25/16; H03K 3/012; H03K 3/01;
(Continued)

(56) References Cited

U.S. PATENT DOCUMENTS 5,012,097 A * 4/1991 Oda .......................... G01J 1/42
250/227.11
5,068,545 A * 11/1991 Molnar ................ H04B 10/802
327/514
(Continued)

FOREIGN PATENT DOCUMENTS

JP        2015-119434 A      6/2015

*Primary Examiner* — John R Lee
(74) *Attorney, Agent, or Firm* — McDermott Will & Emery LLP

(57) ABSTRACT

It is to provide a semiconductor device, a semiconductor system, and a method of controlling the semiconductor device capable of reducing the power consumption. According to one embodiment, a semiconductor device includes a photo coupler control circuit that passes the current to a first signal path for a predetermined period when detecting a change of the input signal supplied from the outside, an insulating circuit that transmits a pulse signal indicating the change of the input signal, from the first signal path to a second signal path insulated from the first signal path, according to the current flow to the first signal path, a holding circuit that generates an input reproducing signal as a reproducing signal of the input signal from the pulse signal transmitted to the second signal path by the insulating circuit, and an internal circuit that receives the input reproducing signal generated by the holding circuit.

11 Claims, 16 Drawing Sheets

(51) Int. Cl.
*H03K 17/78* (2006.01)
*H03K 3/356* (2006.01)
*H03K 3/012* (2006.01)
*H03K 17/955* (2006.01)
*H03K 19/0175* (2006.01)
*H03K 5/1534* (2006.01)

(52) U.S. Cl.
CPC ............. *H03K 3/356* (2013.01); *H03K 17/78* (2013.01); *H03K 17/955* (2013.01); *H03K 19/017509* (2013.01); *H03K 19/017518* (2013.01); *H03K 5/1534* (2013.01)

(58) Field of Classification Search
CPC .......... H03K 3/00; H03K 3/356; H03K 3/353; H03K 17/78; H03K 17/785; H03K 17/79; H03K 17/795; H03K 19/017509; H03K 19/017536; H03K 19/017518; H03K 5/1534; H03K 5/153; H03K 17/945; H03K 17/955; H03K 2017/9455
See application file for complete search history.

(56) References Cited

U.S. PATENT DOCUMENTS

| | | | | |
|---|---|---|---|---|
| 6,282,001 B1* | 8/2001 | Whitney | ................ | H04B 1/587 |
| | | | | 250/551 |
| 6,462,325 B1* | 10/2002 | Yanagisawa | ......... | H04B 10/564 |
| | | | | 250/214 R |
| 6,489,757 B2* | 12/2002 | Ogata | ....................... | G06F 1/26 |
| | | | | 250/551 |
| 6,750,463 B1* | 6/2004 | Riley | ................... | H04B 10/801 |
| | | | | 250/227.14 |
| 7,687,791 B2* | 3/2010 | Graber | ................. | H04B 10/801 |
| | | | | 250/551 |
| 7,732,795 B2* | 6/2010 | Wohrle | ................ | H04B 10/802 |
| | | | | 250/551 |
| 7,763,874 B2* | 7/2010 | Noguchi | ................ | H01H 9/542 |
| | | | | 250/551 |
| 8,614,430 B2* | 12/2013 | Hou | ...................... | H03K 17/223 |
| | | | | 250/551 |
| 2004/0208641 A1* | 10/2004 | Smeulders | ......... | H04B 10/0799 |
| | | | | 398/186 |
| 2005/0098743 A1* | 5/2005 | Tanabe | ................. | H03K 17/941 |
| | | | | 250/551 |
| 2005/0139791 A1* | 6/2005 | Breinlinger | ........ | H03K 17/7955 |
| | | | | 250/551 |
| 2007/0051878 A1* | 3/2007 | Maeda | ............... | H03K 17/7955 |
| | | | | 250/214 R |
| 2009/0073626 A1* | 3/2009 | Saitou | ................ | G01R 31/2635 |
| | | | | 361/91.6 |
| 2009/0279341 A1* | 11/2009 | Forrest | .................... | H01L 23/48 |
| | | | | 365/64 |
| 2010/0327194 A1* | 12/2010 | Xu | ........................ | H04B 10/802 |
| | | | | 250/551 |
| 2010/0327195 A1* | 12/2010 | Huang | .................... | H04B 10/802 |
| | | | | 250/551 |
| 2011/0006188 A1* | 1/2011 | Lin | ........................ | G01S 7/4876 |
| | | | | 250/201.1 |
| 2011/0114858 A1* | 5/2011 | Oono | .................... | G05B 19/054 |
| | | | | 250/551 |
| 2011/0167861 A1* | 7/2011 | Yamamoto | ............... | G05B 9/03 |
| | | | | 62/331 |
| 2013/0240764 A1* | 9/2013 | Kravitz | .................... | G01J 1/44 |
| | | | | 250/551 |
| 2013/0307514 A1* | 11/2013 | O'Connell | ........... | H03K 17/785 |
| | | | | 323/312 |
| 2014/0239205 A1* | 8/2014 | Holtz | ................... | H03K 17/605 |
| | | | | 250/551 |
| 2014/0374629 A1* | 12/2014 | Huang | .................... | H01L 24/34 |
| | | | | 250/551 |
| 2016/0111557 A1* | 4/2016 | Yamazaki | ........... | H01L 31/02016 |
| | | | | 250/551 |
| 2016/0190379 A1* | 6/2016 | Shiraishi | ............ | H03K 17/6877 |
| | | | | 250/551 |
| 2018/0238937 A1* | 8/2018 | Nakajima | ........ | G01R 19/16566 |
| 2019/0140131 A1* | 5/2019 | Waki | .............. | H03K 19/017509 |

* cited by examiner

SEMICONDUCTOR DEVICE, SEMICONDUCTOR SYSTEM, AND METHOD OF CONTROLLING THE SEMICONDUCTOR DEVICE

CROSS-REFERENCE TO RELATED APPLICATIONS

The disclosure of Japanese Patent Application No. 2017-216518 filed on Nov. 9, 2017 including the specification, drawings and abstract is incorporated herein by reference in its entirety.

BACKGROUND

The invention relates to a semiconductor device, a semiconductor system, and a method of controlling the semiconductor device, and particularly, to a semiconductor device, a semiconductor system, and a method of controlling the above device suitable for reducing power consumption.

Generally, an input/output unit of a remote input/output device used in a terminal end of the industrial network, is provided with an insulating circuit for insulating the remote input/output device from an external device. For example, the input/output unit of the remote input/output device is provided with photo couplers for the number of I/O channels as the insulating circuit. Current always runs in these photo couplers, thereby increasing the power consumption in the remote input/output device disadvantageously. As the result, the power consumption increases in a plant using the industrial network system.

The solution to this problem is disclosed in Japanese Unexamined Patent Application Publication No. 2015-119434. An insulating signal transmission circuit disclosed in the above patent suppresses the current running in light emitting diodes, by periodically switching the on and off operation of a switch coupled to the light emitting diodes of the photo couplers in series, hence to reduce the power consumption of the photo couplers.

SUMMARY

In the structure of Japanese Unexamined Patent Application Publication No. 2015-119434, however, the switch is periodically turned on, regardless of whether or not there is a change in the input signal, and when the input signal is fixed to a power supply voltage level (H level), current flows in the light emitting diode every time of turning on the switch. In short, in the structure of the above patent, there still remains a problem of increasing the power consumption. Other problems and novel characteristics will be apparent from the description of the specification and the attached drawings.

According to one embodiment, a semiconductor device includes: a first control circuit that passes a current in a first signal path of a first power system for a predetermined period only when detecting a change of a first input signal supplied from outside; a first insulating unit that transmits a first pulse signal indicating the change of the first input signal, from the first signal path to a second signal path of a second power system insulated from the first signal path, according to a current flow to the first signal path; a first holding circuit that reproduces the first input signal from the first pulse signal transmitted to the second signal path by the first insulating unit; and a first internal circuit that receives the first input signal reproduced by the first holding circuit.

According to another embodiment, a method of controlling a semiconductor device includes the following steps of: passing a current to a first signal path of a first power system for a predetermined period only when detecting a change of a first input signal supplied from outside; transmitting a first pulse signal indicating the change of the first input signal, from the first signal path to a second signal path of a second power system insulated from the signal path, according to the current flow to the first signal path; reproducing the first input signal from the first pulse signal transmitted to the second signal path; and supplying the reproduced first input signal to a first internal circuit.

The above one embodiment can provide a semiconductor device, a semiconductor system, and a method of controlling the semiconductor device capable of reducing the power consumption.

DETAILED DESCRIPTION

Figure 1:
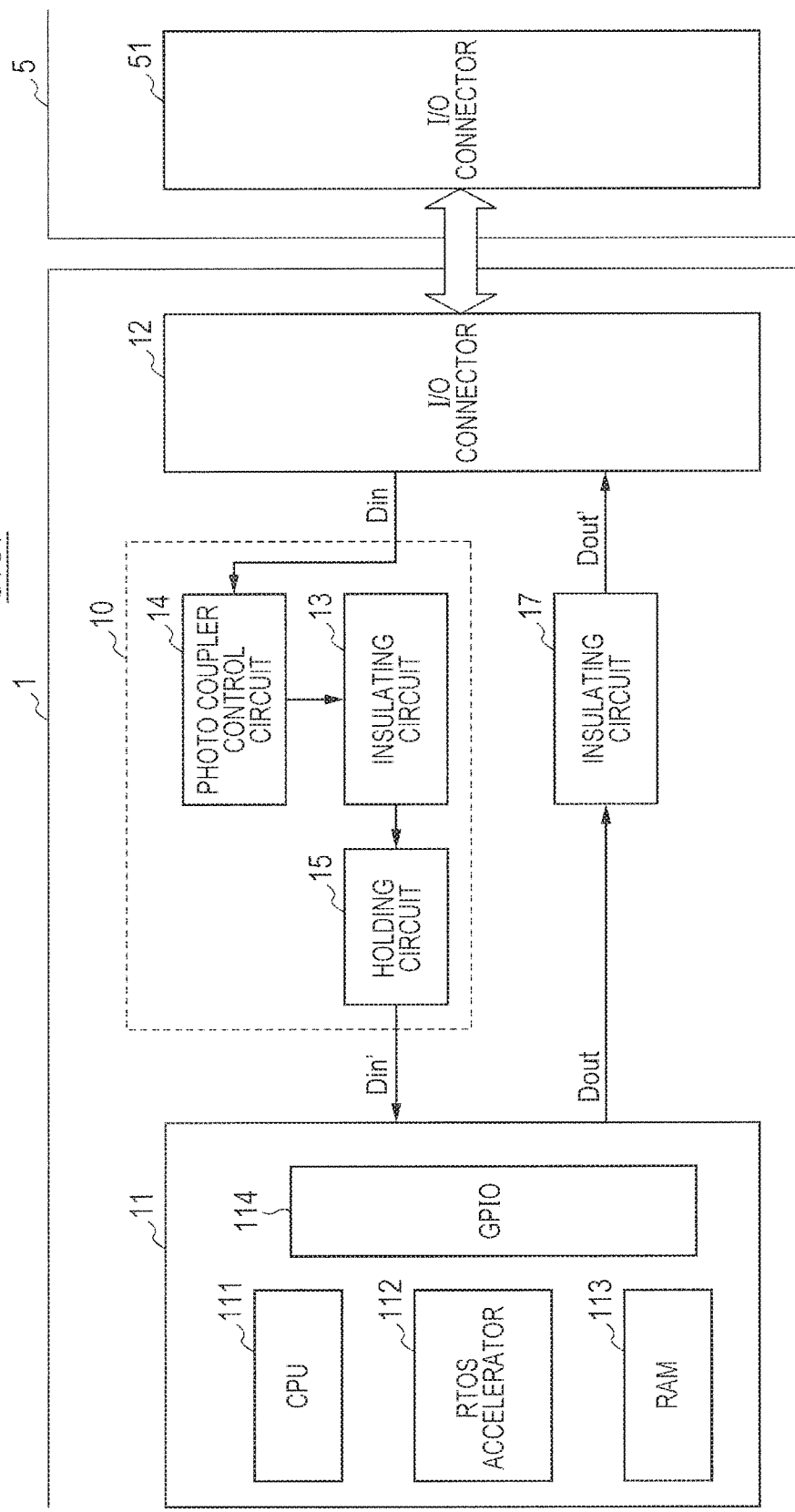
FIG. 1 is a block diagram showing a constitutional example of a semiconductor system with a semiconductor device according to a first embodiment mounted there.

Hereinafter, embodiments will be described with reference to the drawings. Although the drawings are simplified, the technical scope of the embodiments is not to be interpreted narrowly based on the description of the drawings. The same reference numerals are attached to the same elements and the overlapping description is omitted.

In the following description, the subject matter will be divided into a plurality of sections or embodiments if necessary for the sake of convenience; however, they are not unrelated to each other unless otherwise specified, but are in such a relation that one represents a modification example, the application example, the details, the supplementary explanation, or the like of a part or all of the other. Further, in the following embodiments, if reference is made to any number of elements or the like (including the number of units, numeric value, quantity, range, and the like), the invention is not to be restricted to that but the number may be more or less than the value unless otherwise explicitly specified and apparently limited to a specific value in principle.

Further, in the following embodiments, the components (including the operational steps) are not necessarily essential unless otherwise specifically stated and apparently considered to be essential in principle. Similarly, in the following embodiments, if reference is made to a shape, positional relationship, or the like of any component or the like, those substantially approximate or similar to that shape or the like are to be included. This is the same with the above-mentioned number (the number of units, numeric value, quantity, range, and the like).

First Embodiment

FIG. 1 is a block diagram showing a constitutional example of a semiconductor system SYS1 with a semiconductor device 1 according to a first embodiment mounted there. The semiconductor device 1 is, for example, a remote input/output device used in a terminal end on the industrial network, to receive an input signal supplied from an external device through an insulating circuit such as a photo coupler. In the case of detecting a change of the input signal supplied from the external device, the semiconductor device 1 drives the insulating circuit, hence to reduce the power consumed by the insulating circuit. Hereinafter, the details will be described.

As shown in FIG. 1, the semiconductor system SYS1 includes the semiconductor device 1 and an external device 5.

The semiconductor device 1 includes one or a plurality of semiconductor chips, for example, including an internal circuit 11, an I/O connector 12, an insulating circuit (insulator) 13, a photo coupler control circuit 14, a holding circuit 15, and an insulating circuit 17, in one package. The insulating circuit 13, the photo coupler control circuit 14, and the holding circuit 15 form an insulating signal transmission circuit 10.

The external device 5 is provided outside of the package of the semiconductor device 1, to transfer signals to and from the semiconductor device 1. The external device 5 adopts the same mechanism of the insulating circuit as the semiconductor device 1.

In the semiconductor device 1, the I/O connector 12 is coupled to the I/O connector 51 of the external device 5, interfacing signals between the semiconductor device 1 and the external device 5. In the example of FIG. 1, the input signal Din from the external device 5 is supplied to the semiconductor device 1 through the I/O connector 12. Further, the output signal Dout generated by the internal circuit 11 of the semiconductor device 1 is supplied to the external device 5 through the I/O connector 12.

The insulating signal transmission circuit 10 transmits the input signal Din supplied from the external device 5 to another signal path insulated from the signal path of the above input signal Din as an input reproducing signal Din'. The input reproducing signal Din' transmitted to the other signal path through the insulating signal transmission circuit 10 is entered into the internal circuit 11.

In the insulating signal transmission circuit 10, when detecting a change of the logic level of the input signal Din, the photo coupler control circuit 14 supplies a power supply voltage VDD1 to the insulating circuit 13 for a predetermined period. The insulating circuit 13 is driven when the photo coupler control circuit 14 supplies the power supply voltage VDD1 there, and transmits a change of the input signal Din (in short, a pulse signal indicating the change of the input signal Din) from the signal path where the power supply voltage VDD1 is supplied to another signal path where the power supply voltage VDD2 is supplied. Here, the predetermined period indicates a period long enough for the insulating circuit 13 to transmit the change of the input signal Din from one signal path to the other signal path. The holding circuit 15 generates the input reproducing signal Din' as the reproducing signal of the input signal Din, according to the change of the input signal Din transmitted by the insulating circuit 13. The input reproducing signal Din' generated by the holding circuit 15 is entered into the internal circuit 11. Here, the insulating signal transmission circuit 10 drives the insulating circuit 13 only in the case of detecting a change of the input signal Din; therefore, the power consumed by the insulating circuit 13 can be reduced.

(First Constitutional Example of Insulating Signal Transmission Circuit 10)

Figure 2:
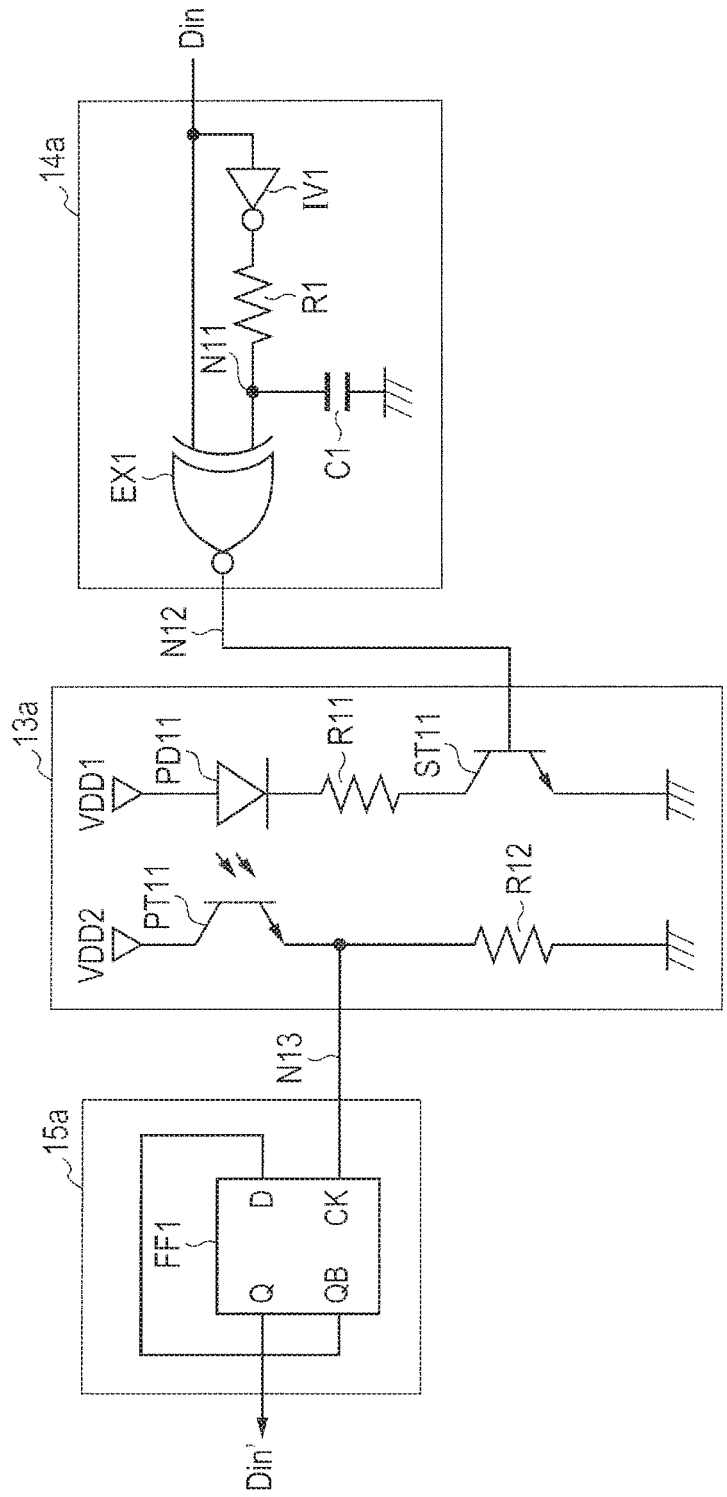
FIG. 2 is a view concretely showing a first constitutional example of an insulating signal transmission circuit provided in the semiconductor device shown in FIG. 1.
Figure 3:
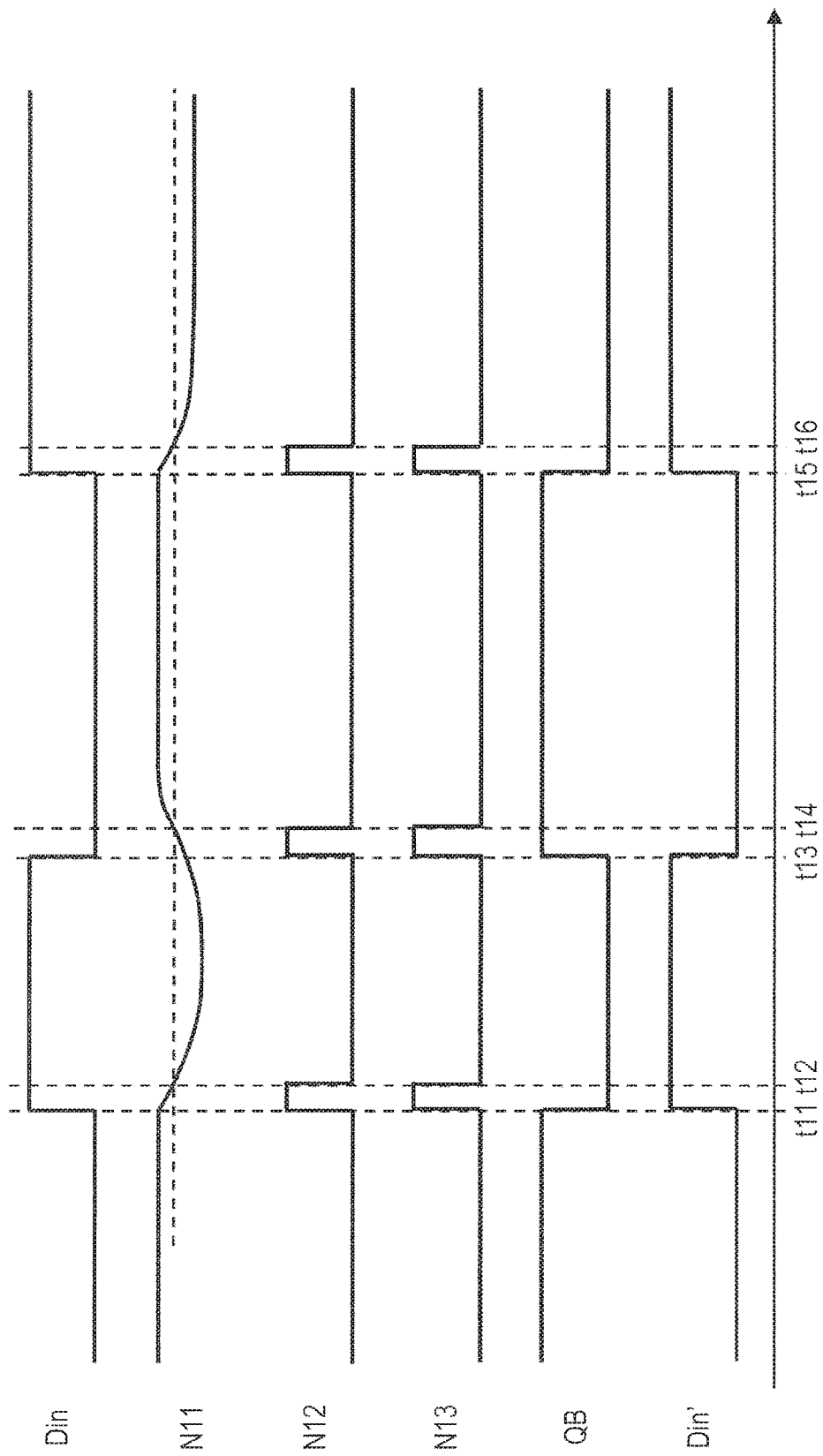
FIG. 3 is a timing chart showing a receiving operation of the insulating signal transmission circuit shown in FIG. 2.

FIG. 2 is a view concretely showing a first constitutional example of the insulating signal transmission circuit 10 as an insulating signal transmission circuit 10a. FIG. 3 is a timing chart showing the operation of the insulating signal transmission circuit 10a. In the example of FIG. 2, the insulating circuit 13, the photo coupler control circuit 14, and the holding circuit 15 forming the insulating signal transmission circuit 10 are respectively shown as an insulating circuit 13a, a photo coupler control circuit 14a, and a holding circuit 15a in the insulating signal transmission circuit 10a.

The photo coupler control circuit 14a includes an inverter IV1, a resistance element R1, a capacity element C1, and an exclusive NOR circuit (referred to as XNOR circuit) EX1. The inverter IV1 outputs an inversion signal of the input signal Din. Here, the output signal of the inverter IV1 (the voltage level of the node N11) changes in delay (time t12, t14, and t16 in FIG. 3) with the time corresponding to the time constant determined by the resistance value of the resistance element R1 and the capacity value of the capacity element C1, from the change of the input signal Din (time t11, t13, and t15 in FIG. 3). The XNOR circuit EX1 outputs an exclusive NOR of the input signal Din and a signal obtained by delaying the inversion signal of the input signal Din (the voltage of the node N11). In short, when detecting a change of the input signal Din, the photo coupler control circuit 14a turns the output signal active (H level) for a predetermined period (time t11 to t12 in FIG. 3, time t13 to t14, time t15 to t16). In other words, the photo coupler control circuit 14a generates pulse in the output signal when detecting the change of the input signal Din.

The insulating circuit 13a is, for example, a photo coupler, including a light emitting diode PD11, a photo transistor PT11, resistance elements R11 and R12, and a switching transistor ST11.

The light emitting diode PD11, the resistance element R11, and the switching transistor ST11 are provided in series in the signal path (first signal path) between the power supply voltage terminal where the power supply voltage VDD1 is supplied (hereinafter, referred to as a power supply voltage terminal VDD1) and the ground voltage terminal where the ground voltage GND is supplied (hereinafter, referred to as a ground voltage terminal GND). Current flowing between the collector and the emitter of the switching transistor ST11 is controlled by the output signal (the current of the node N12) of the photo coupler control circuit 14a. Specifically, during the period when the output signal of the photo coupler control circuit 14a is active (H level) after detecting the change of the input signal Din, current flows between the collector and the emitter of the switching transistor ST11, and otherwise, current does not flow. The light emitting diode PD11 emits light during the period of current flowing after turning on the switching transistor ST11.

The photo transistor PT11 and the resistance element R12 are provided in series in another signal path (second signal path) insulated from the first signal path, between the power supply voltage terminal where the power supply voltage VDD2 different from the power supply voltage VDD1 is supplied (hereinafter, referred to as the power supply voltage terminal VDD2) and the ground voltage terminal GND. When the light emitting diode PD11 emits light, current flows between the collector and the emitter of the photo transistor PT11. Since current flows also in the resistance element R12, the voltage of the node N13 between the photo transistor PT11 and the resistance element R12 indicates the power supply voltage VDD2 level (H level). On the contrary, when the light emitting diode PD11 does not emit light, current does not flow between the collector and the emitter of the photo transistor PT11. Since current does not flow to the resistance element R12, the voltage of the node N13 indicates the ground voltage level (L level). In short, the voltage of the node N12 is transmitted to the node N13 through the insulating circuit 13a. The voltage of the node N13 is output as the output signal of the insulating circuit 13a.

The holding circuit 15a includes, for example, a flip-flop FF1. The input terminal D of the flip-flop FF1 is pulled up in the inside and set at the power supply voltage VDD2 level (H level) at the power on. Then, the flip-flop FF1 takes in and outputs the inversion signal QB of the output signal Q of the flip-flop FF1 in synchronization with the rising of the output signal (the voltage of the node N13) of the insulating circuit 13a. In other words, the flip-flop FF1 inverts the output signal Q in synchronization with the rising of the output signal of the insulating circuit 13a (time t11, t13, and t15 in FIG. 3). The holding circuit 15a outputs the output signal Q of the flip-flop FF1 to the internal circuit 11 as the reproducing signal Din' of the input signal Din.

Returning to FIG. 1, the description will be made continuously. The insulating circuit 17 transmits the output signal Dout generated by the internal circuit 11 to the other signal path insulated from the signal path of the above output signal Dout, as an output reproducing signal Dout'. The output reproducing signal Dout' transmitted to the other signal path through the insulating circuit 17 is output to the external device 5 through the I/O connector 12.

The internal circuit 11 performs predetermined processing based on the input signal Din received from the external device 5 and transmits the processing result to the external device 5 as the output signal Dout. The internal circuit 11 includes, for example, Central processing Unit (CPU) 111, a Real Time OS (RTOS) accelerator 112, a Random Access Memory (RAM) 113, and General Purpose Input/Output (GPIO) 114.

In the internal circuit 11, the CPU 111 executes a program of a specified address, for example, from a plurality of programs stored in the RAM 113. The RAM 113 stores the processing results by the CPU 111 and the input signal Din (specifically, the input reproducing signal Din' obtained through the insulating signal transmission circuit 10) supplied from the outside, in addition to a plurality of programs executed by the CPU 111. The RTOS accelerator 112 has, for example, a function of improving a response to an interruption and a task switching speed, in order to secure a real time performance of the internal circuit 11. The RTOS accelerator 112 is installed, for example, by hardware. The GPIO 114 is a general input/output port, interfacing the signals transferred between the internal circuit 11 and the outside. For example, the input reproducing signal Din' is stored in the RAM 113 through the GPIO 114 and the data read from the RAM 113 is output through the GPIO 114 as the output signal Dout. Here, the internal circuit 11 is not restricted to the above mentioned components but also other components may be provided.

(Flow Chart)

Figure 4:
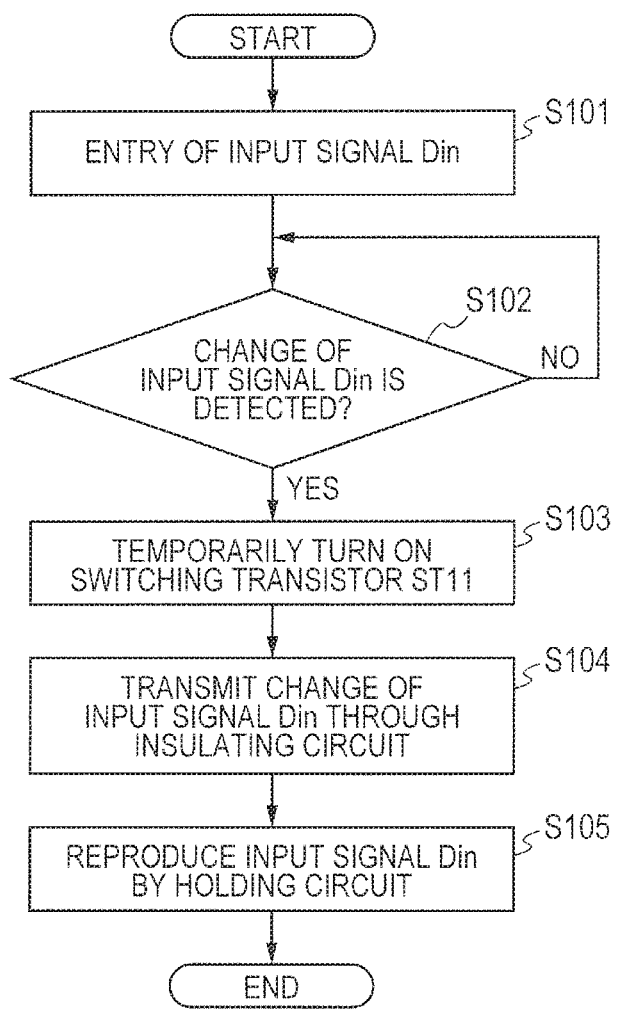
FIG. 4 is a flow chart showing the receiving operation of the semiconductor device using the insulating signal transmission circuit shown in FIG. 2.

Continuously, a receiving operation of the semiconductor device 1 will be described using FIG. 4. FIG. 4 is a flow chart indicating the receiving operation of the semiconductor device 1.

In the example of FIG. 4, at first, the input signal Din from the external device 5 is supplied to the semiconductor device 1 (Step S101). When the logic level of the input signal Din does not change (NO in Step S102), the insulating signal transmission circuit 10 does not operate because the switching transistor ST11 is not turned on. On the contrary, when detecting a change of the logic level of the input signal Din (YES in Step S102), the insulating signal transmission circuit 10 operates during a predetermined period because the switching transistor ST11 is turned on for the predetermined period (Step S103). According to this, the change of the input signal Din (in short, the pulse signal indicating the change of the input signal Din) is transmitted from the signal path where the power supply voltage VDD1 is supplied to the other signal path where the power supply voltage VDD2 is supplied, through the insulating circuit 13 (Step S104). The holding circuit 15 generates the input reproducing signal Din' as the reproducing signal of the input signal Din, according to the change of the input signal Din transmitted through the insulating circuit 13 (Step S105). The input reproducing signal Din generated by the holding circuit 15 is entered into the internal circuit 11.

As mentioned above, the semiconductor device 1 and the semiconductor system SYS1 having the same according to the embodiment drives the insulating circuit 13 only in the case of detecting a change of the input signal Din, hence to reduce the power consumed by the insulating circuit 13.

In the structure of Japanese Unexamined Patent Application Publication No. 2015-119434, the insulating circuit is periodically driven regardless of whether or not there is a change of the input signal; therefore, when the input signal is fixed to the power supply voltage level (H level), current flows in the light emitting diode every time the insulating circuit is driven. On the contrary, in the structure of the semiconductor device 1 and the semiconductor system SYS1 according to the embodiment, the insulating circuit is driven only in the case of detecting a change of the input signal, hence to avoid a wasteful current flow into the light emitting diode. Further, it never fails in detecting a change of the input signal. As the result, the power consumption of the photo coupler can be reduced.

The insulating signal transmission circuit 10 is not restricted to the constitutional example shown in FIG. 2. The other concrete constitutional example of the insulating signal transmission circuit 10 will be described in the below.

(Second Constitutional Example of Insulating Signal Transmission Circuit 10)

Figure 5:
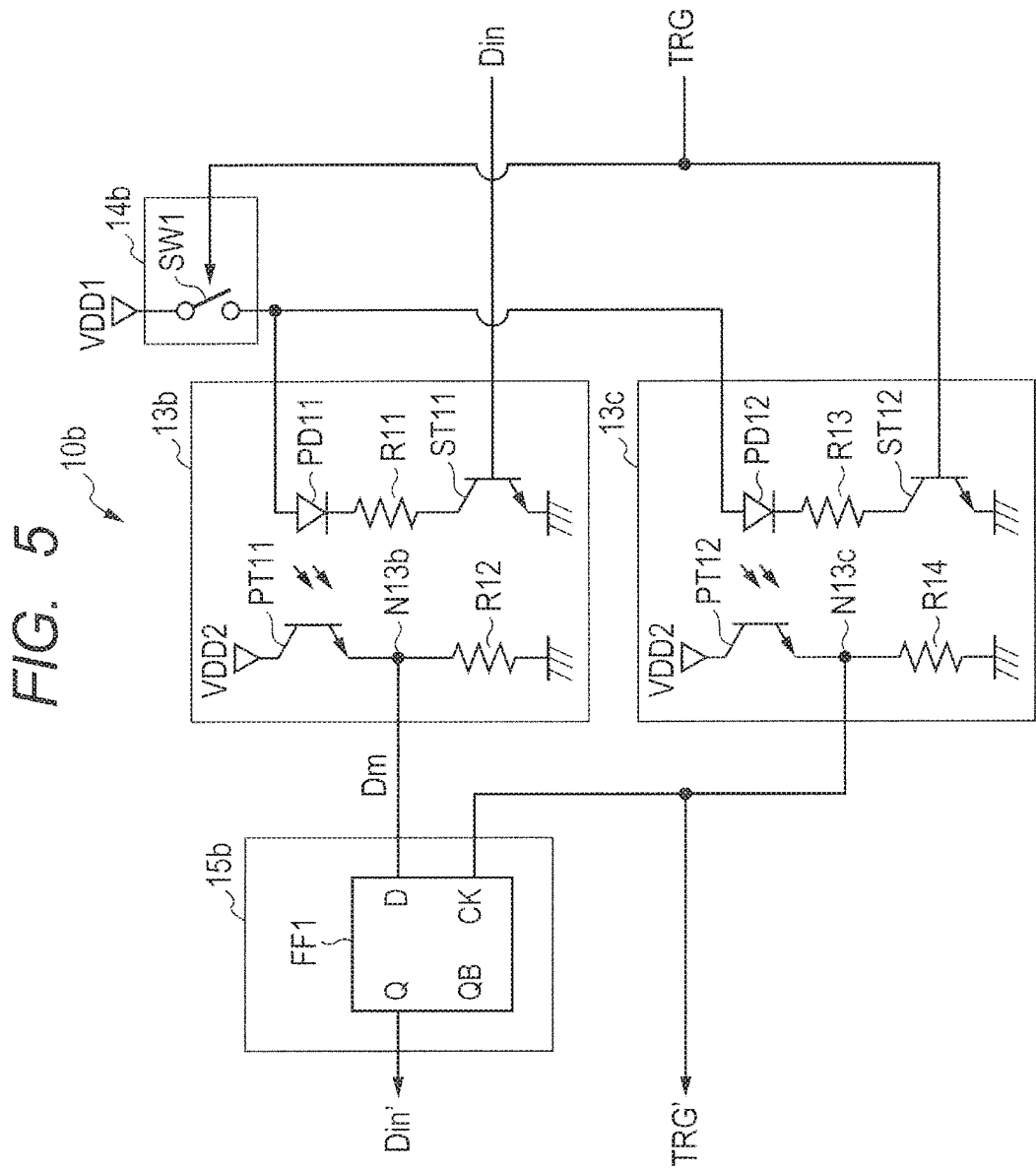
FIG. 5 is a view concretely showing a second constitutional example of the insulating signal transmission circuit provided in the semiconductor device shown in FIG. 1.
Figure 6:
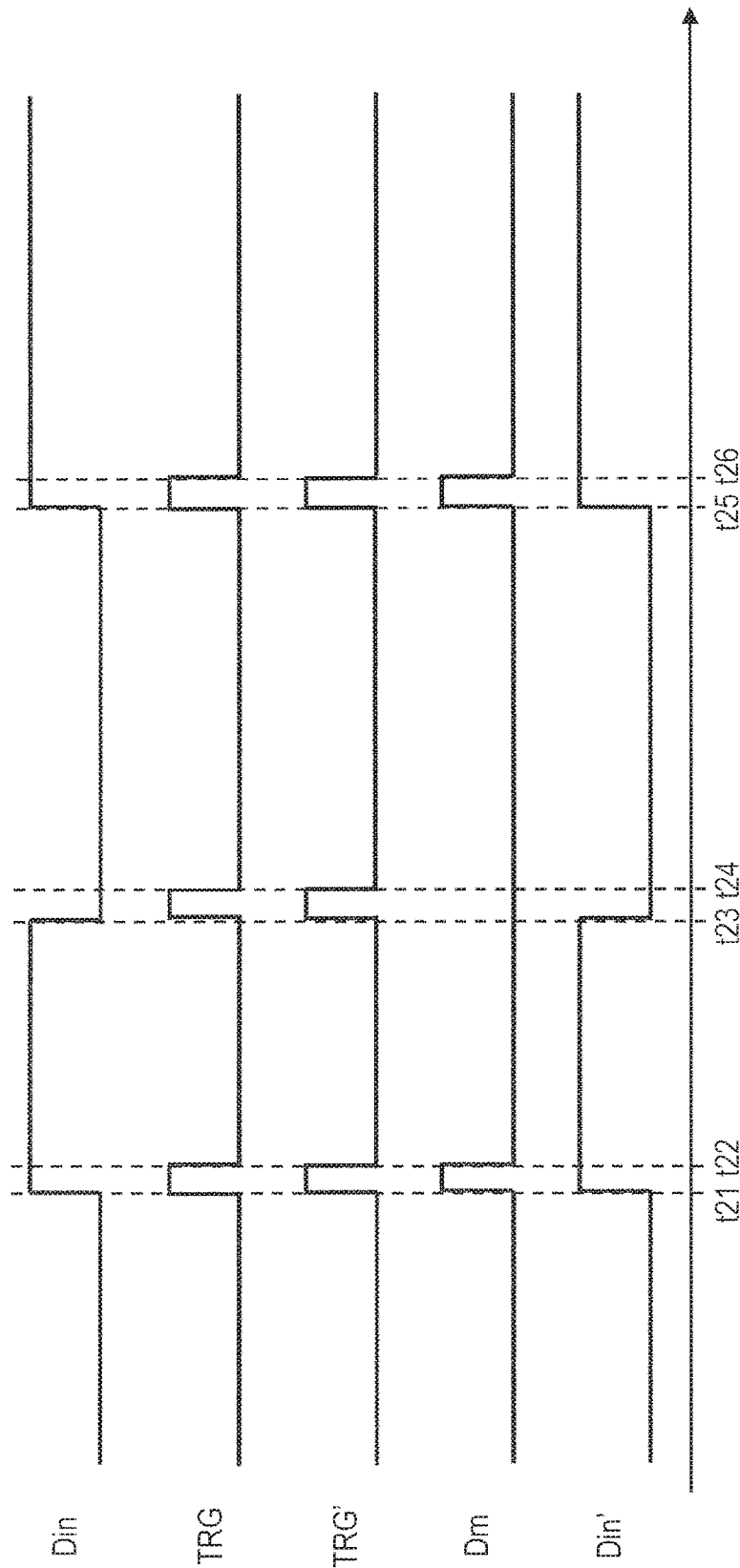
FIG. 6 is a timing chart showing the receiving operation of the insulating signal transmission circuit shown in FIG. 5.

FIG. 5 is a view concretely showing a second constitutional example of the insulating signal transmission circuit 10 as an insulating signal transmission circuit 10b. FIG. 6 is a timing chart showing the operation of the insulating signal transmission circuit 10b. In the example of FIG. 5, the insulating circuit 13, the photo coupler control circuit 14, and the holding circuit 15 forming the insulating signal transmission circuit 10 are respectively shown as insulating circuits 13b and 13c, a photo coupler control circuit 14b, and a holding circuit 15b in the insulating signal transmission circuit 10b.

In the example of FIG. 5, not only the input signal Din but also a trigger signal TRG is supplied from the external device 5 to the semiconductor device 1. The trigger signal TRG is a signal that becomes active for a predetermined period at a change time of the input signal Din, which may be directly supplied from the external device 5 having a trigger signal generating circuit or may be generated in the semiconductor device 1 based on the input signal Din.

The photo coupler control circuit 14b has a switching element SW1 provided between the power supply voltage terminal VDD1 and the light emitting diodes PD11 and PD12. The switching element SW1 is turned on when the trigger signal TRG is active (when pulse is generated); otherwise, it is turned off. In other words, the switching element SW1 is turned on for a predetermined period when the input signal Din changes, to supply the power supply voltage VDD1 to the insulating circuits 13b and 13c (time t21 to t22, time t23 to t24, time t25 to t26 in FIG. 6).

The insulating circuit 13b has the same circuit structure as the insulating circuit 13. However, the on/off operation of the switching transistor ST11 is controlled according to the input signal Din.

For example, when the input signal Din rises up, the switching transistor ST11 is turned on accordingly. Simultaneously with the rise of the input signal Din, the trigger signal TRG rises up and the switching element SW1 is turned on for a predetermined period. Therefore, current flows in the light emitting diode PD11. The light emitting diode PD11 emits light (time t21 to t22, time t25 to t26). On the contrary, at a rising timing of the input signal Din, the trigger signal TRG also rises up and the switching element SW1 is turned on for a predetermined period; however, the switching transistor ST11 is turned off, and therefore current does not flow in the light emitting diode PD11. The light emitting diode PD11 does not emit light (time t23 to t24).

Since the current flows in the photo transistor PT11 during the light emission of the light emitting diode PD11, the voltage Dm of the node N13b between the photo transistor PT11 and the resistance element R12 indicates the H level. On the contrary, during no light emission of the light emitting diode PD11, current does not flow in the photo transistor PT11 and the voltage Dm indicates the L level. Thus, the information of the rise of the input signal Din (pulse signal) is transmitted to the node N13b through the insulating circuit 13b (time t21 to t22, time t25 to t26). The voltage Dm of the node N13b is output as the output signal of the insulating circuit 13b.

The insulating circuit 13c includes a light emitting diode PD12, a photo transistor PT12, resistance elements R13 and R14, and a switching transistor ST12. The light emitting diode PD12, the photo transistor PT12, the resistance elements R13 and R14, and the switching transistor ST12 respectively correspond to the light emitting diode PD11, the photo transistor PT11, the resistance elements R11 and R12, and the switching transistor ST11. However, the on/off operation of the switching transistor ST12 is controlled according to the trigger signal TRG.

For example, when pulse is generated in the trigger signal TRG according to a change of the input signal Din, the switching transistor ST12 is turned on for a predetermined period and the switching element SW1 is turned on for a predetermined period; therefore, current flows in the light emitting diode PD12 for a predetermined period. As the result, the light emitting diode PD12 emits light (time t21 to t22, time t23 to t24, and time t25 to t26).

Since the current flows in the photo transistor PT12 during the light emission of the light emitting diode PD12, the voltage of the node N13c between the photo transistor PT12 and the resistance element R14 indicates the H level. On the contrary, since the current does not flow in the photo transistor PT12 during a period without light emission by the light emitting diode PD12, the voltage of the node N13c indicates the L level. According to this, the trigger signal TRG (that is, the information about a change of the input signal Din) is transmitted to the node N13c through the insulating circuit 13c (time t21 to t22, time t23 to t24, and time t25 to t26). The voltage of this node N13c is output as the output signal of the insulating circuit 13c (also referred to a trigger signal TRG').

The holding circuit 15b includes, for example, a flip-flop FF1. The input terminal D of the flip-flop FF1 is pulled up in the inside and set at the power supply voltage VDD2 level (H level) at the power on. Then, the flip-flop FF1 takes in and outputs the output signal of the insulating circuit 13b (the voltage of the node N13b), in synchronization with the rising of the output signal of the insulating circuit 13c (the voltage of the node N13c). The holding circuit 15b outputs the output signal Q of the flip-flop FF1 to the internal circuit 11 as the reproducing signal Din' of the input signal Din.

In the structure of FIG. 5, the case of using one trigger signal TRG as for one input signal Din has been described; however, the invention is not restricted to this. A structure of using a common trigger signal TRG for several bits of the input signal Din may be properly adopted. For example, when the common trigger signal TRG is used for each bit of the four bit width of the input signal Din, the insulating circuit 13b and the holding circuit 15b, of the components of the insulating signal transmission circuit 10b, are provided for each of the four bits, while one photo coupler control circuit 14b and one insulating circuit 13c are provided.

(First Modified Example of Semiconductor System SYS1)

Figure 7:
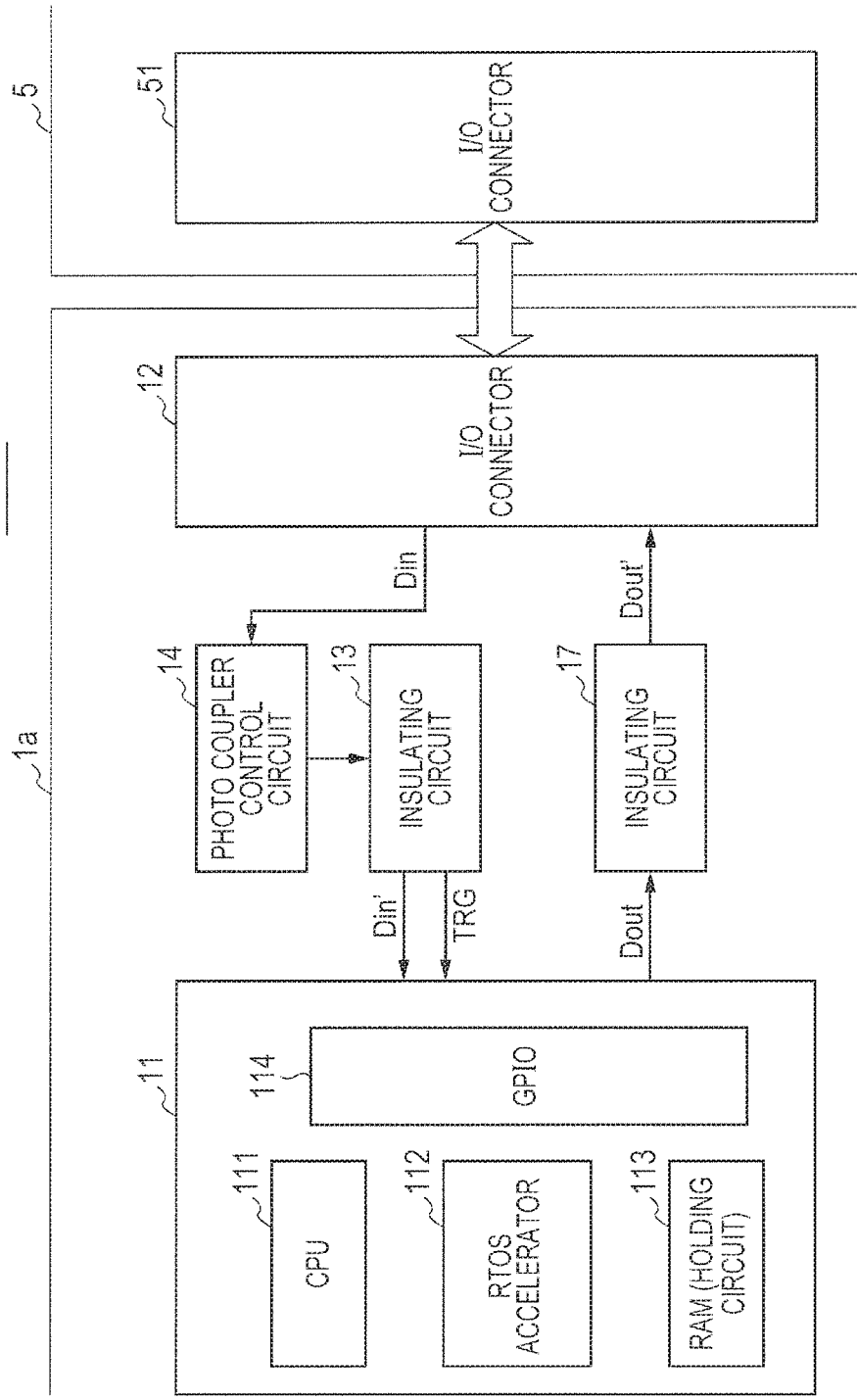
FIG. 7 is a block diagram showing a first modified example of the semiconductor device and the semiconductor system having the same shown in FIG. 1.

FIG. 7 is a block diagram showing a first modified example of the semiconductor system SYS1 as a semiconductor system SYS1a.

The semiconductor system SYS1a includes a semiconductor device 1a and the external device 5. The semiconductor device 1a uses a part of the RAM 113 provided in the internal circuit 11, instead of the holding circuit 15 in the semiconductor device 1. The photo coupler control circuit 14 includes a trigger signal generating circuit (not illustrated) for generating a trigger signal TRG. The trigger signal TRG is supplied to the internal circuit 11 through the insulating circuit 13 and the GPIO 114. The input reproducing signal Din' is supplied to the internal circuit 11 through the GPIO 114 and taken in by the RAM 113, for example, in synchronization with a rise of the trigger signal TRG. The other components of the semiconductor device 1a are the same as the semiconductor device 1, and therefore, their description is omitted.

The semiconductor device 1a and the semiconductor system SYS1a having the same can achieve the same effects as the semiconductor device 1 and the semiconductor system SYS1 having the same. Further, the semiconductor device 1a and the semiconductor system SYS1a having the same can reduce the circuit size because it is not necessary to provide the holding circuit 15.

The structure of the insulating signal transmission circuit 10b may be adopted to the semiconductor system SYS1a. In this case, the input reproducing signal Din' is taken by the RAM 113 in synchronization with a rise of the trigger signal TRG' generated in the insulating signal transmission circuit 10b.

(Second Modified Example of Semiconductor System SYS1)

Figure 8:
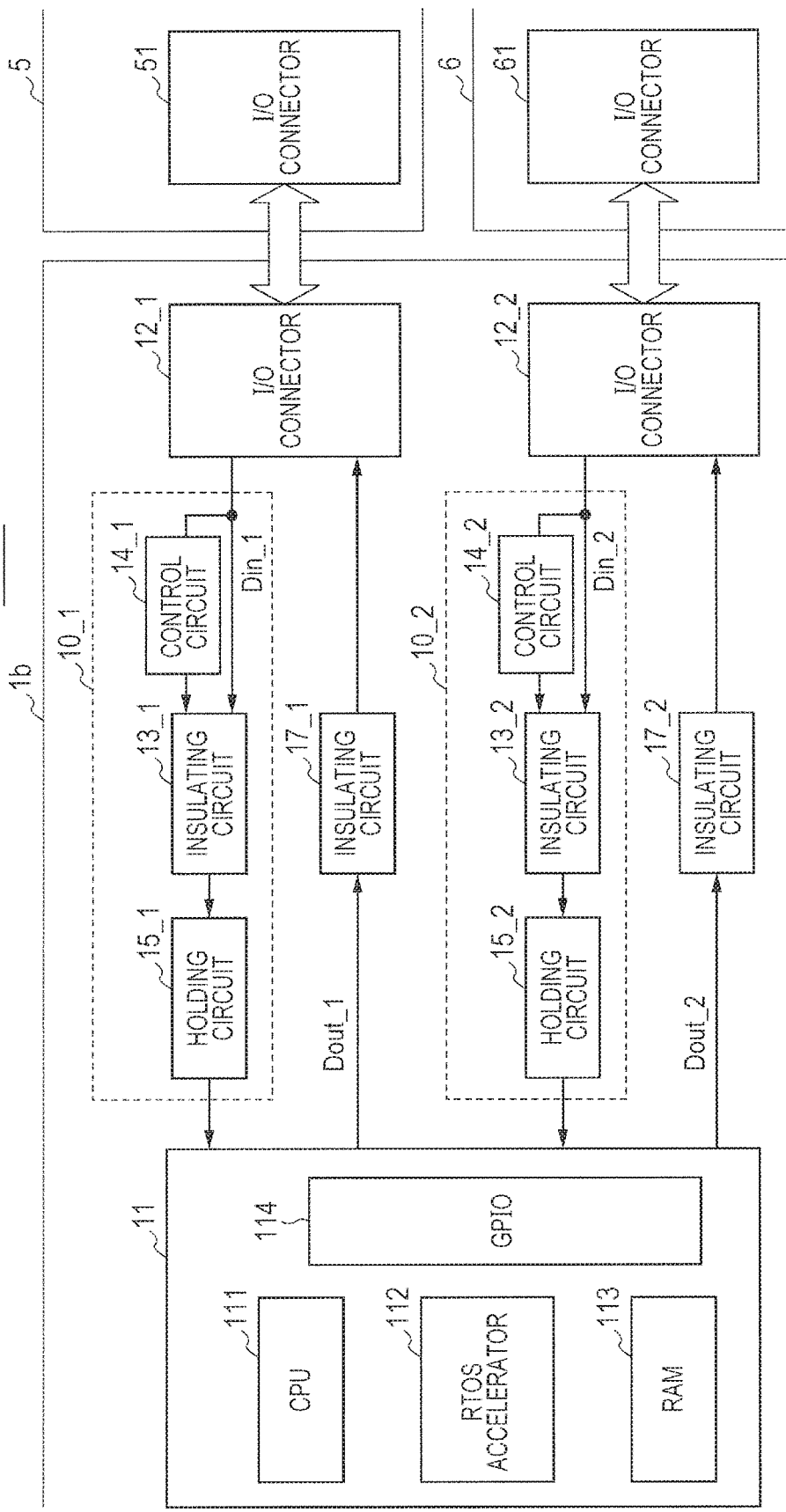
FIG. 8 is a block diagram showing a second modified example of the semiconductor device and the semiconductor system having the same shown in FIG. 1.

FIG. 8 is a block diagram showing a second modified example of the semiconductor system SYS1 as a semiconductor system SYS1b. The semiconductor system SYS1 is provided with one external device 5. On the contrary, the semiconductor system SYS1b is provided with two external devices 5 and 6. The semiconductor system SYS1b includes a semiconductor device 1b and the external devices 5 and 6. The external devices 5 and 6 are both provided outside of the package of the semiconductor device 1b, to transfer signals to and from the semiconductor device 1b. The mechanism of the insulating circuit same as that of the semiconductor device 1 is used for the respective external devices 5 and 6.

The semiconductor device 1b includes an internal circuit 11, I/O connectors 12_1 and 12_2, insulating circuits 13_1 and 13_2, photo coupler control circuits 14_1 and 14_2, holding circuits 15_1 and 15_2, and insulating circuits 17_1 and 17_2. The insulating circuit 13_1, the photo coupler control circuit 14_1, and the holding circuit 15_1 form the insulating signal transmission circuit 10_1. The insulating circuit 13_2, the photo coupler control circuit 14_2, and the holding circuit 15_2 form the insulating signal transmission circuit 10_2.

In the semiconductor device 1b, the I/O connector 12_1 is coupled to an I/O connector 51 of the external device 5, to interface signals transferred between the semiconductor device 1b and the external device 5. The I/O connector 12_2 is coupled to an I/O connector 61 of the external device 6, to interface signals transferred between the semiconductor device 1b and the external device 6.

The insulating signal transmission circuits 10_1 and 10_2 have the same circuit structure as the insulating signal transmission circuit 10b, for example, shown in FIG. 5. However, the trigger signal TRG (the pulse signal indicating a change of the input signals Din_1 and Din_2) is to be generated within each of the insulating signal transmission circuits 10_1 and 10_2. The insulating signal transmission circuit 10_1 transmits the input signal Din_1 supplied from the external device 5 to another signal path insulated from the signal path of the above input signal Din_1 as an input reproducing signal Din_1'. The input reproducing signal Din_1' transmitted to the other signal path through the insulating signal transmission circuit 10_1 is entered into the internal circuit 11. The insulating signal transmission circuit 10_2 transmits the input signal Din_2 supplied from the external device 6 to another signal path insulated from the signal path of the above input signal Din_2 as an input reproducing signal Din_2'. The input reproducing signal Din_2' transmitted to the other signal path through the insulating signal transmission circuit 10_2 is entered into the internal circuit 11.

Specifically, in the insulating signal transmission circuit 10_1, when detecting a change of the logic level of the input signal Din_1, the photo coupler control circuit 14_1 supplies the power supply voltage VDD1 to the insulating circuit 13_1 for a predetermined period. The insulating circuit 13_1 is driven when the photo coupler control circuit 14_1 supplies the power supply voltage VDD1, to transmit the change of the input signal Din_1 (in short, the pulse signal indicating the change of the input signal Din_1) from the signal path where the power supply voltage VDD1 is supplied to the other signal path where the power supply voltage VDD2 is supplied. The holding circuit 15_1 generates the input reproducing signal Din_1' as the reproducing signal of the input signal Din_1, according to the change of the input signal Din_1 transmitted by the insulating circuit 13_1. The input reproducing signal Din_1' generated by the holding circuit 15_1 is entered into the internal circuit 11. Here, the insulating signal transmission circuit 10_1 drives the insulating circuit 13_1 only in the case of detecting the change of the input signal Din_1; therefore, the power consumed by the insulating circuit 13_1 can be reduced.

Further, in the insulating signal transmission circuit 10_2, when detecting a change of the logic level of the input signal Din_2, the photo coupler control circuit 14_2 supplies the power supply voltage VDD1 to the insulating circuit 13_2 for a predetermined period. The insulating circuit 13_2 is driven when the photo coupler control circuit 14_2 supplies the power supply voltage VDD1, to transmit the change of the input signal Din_2 (in short, the pulse signal indicating the change of the input signal Din_2) from the signal path where the power supply voltage VDD1 is supplied to the other signal path where the power supply voltage VDD2 is supplied. The holding circuit 15_2 generates the input reproducing signal Din_2' as the reproducing signal of the input signal Din_2, according to the change of the input signal Din_2 transmitted by the insulating circuit 13_2. The input reproducing signal Din_2' generated by the holding circuit 15_2 is entered into the internal circuit 11. Here, the insulating signal transmission circuit 10_2 drives the insulating circuit 13_2 only in the case of detecting the change of the input signal Din_2; therefore, the power consumed by the insulating circuit 13_2 can be reduced.

In the example of FIG. 8, the case of providing two external devices 5 and 6 has been described; however, the invention is not restricted to this but three and more external devices for transferring signals to and from the semiconductor device 1b may be provided. In the example of FIG. 8, the case of using the common connector for input and output (so-called I/O connector) has been described; however, the invention is not restricted to this but separate connectors may be used for input and output.

(Third Modified Example of Semiconductor System SYS1)

Figure 9:
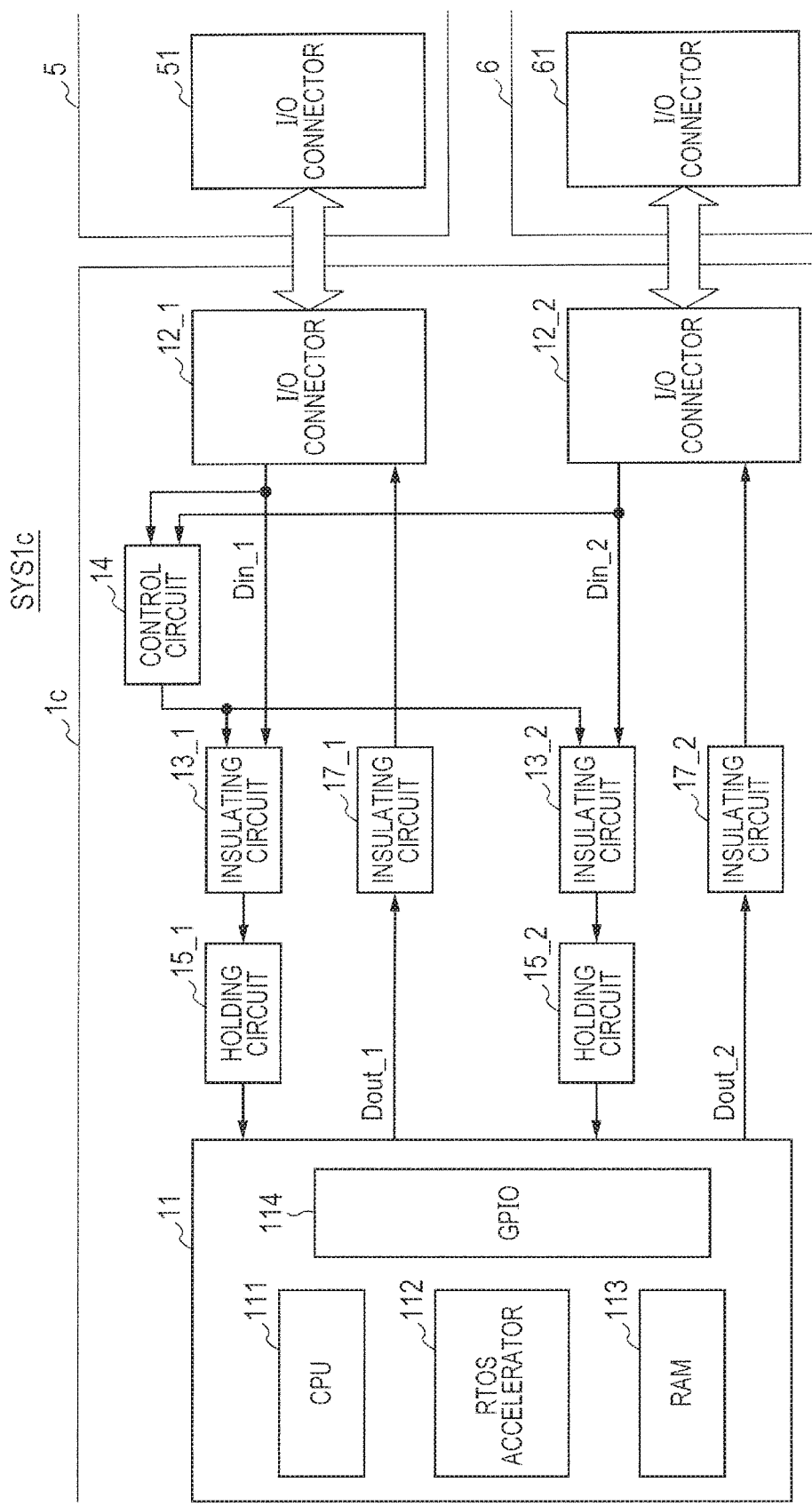
FIG. 9 is a block diagram showing a third modified example of the semiconductor device and the semiconductor system having the same shown in FIG. 1.

FIG. 9 is a block diagram showing a third modified example of the semiconductor system SYS1 as a semiconductor system SYS1c.

The semiconductor system SYS1c includes a semiconductor device 1c and the external devices 5 and 6. The semiconductor device 1c includes one photo coupler control circuit 14 commonly used for two receiving paths, instead of the two photo coupler control circuits 14_1 and 14_2 respectively provided in the two receiving paths in the semiconductor device 1b. The other components of the semiconductor device 1c are the same as those of the semiconductor device 1b; therefore, their description is omitted.

The semiconductor device 1c and the semiconductor system SYS1c having the same drive the insulating circuits 13_1 and 13_2 only in the case of detecting a change of the input signals Din_1 and Din_2; therefore, the power consumed by the insulating circuits 13_1 and 13_2 can be reduced. Although the semiconductor device 1c and the semiconductor system SYS1c having the same are inferior to the semiconductor device 1b and the semiconductor system SYS1b having the same in reducing the power consumption, they can reduce the number of the photo coupler control circuits, hence to suppress an increase in the circuit size.

Second Embodiment

Figure 10:
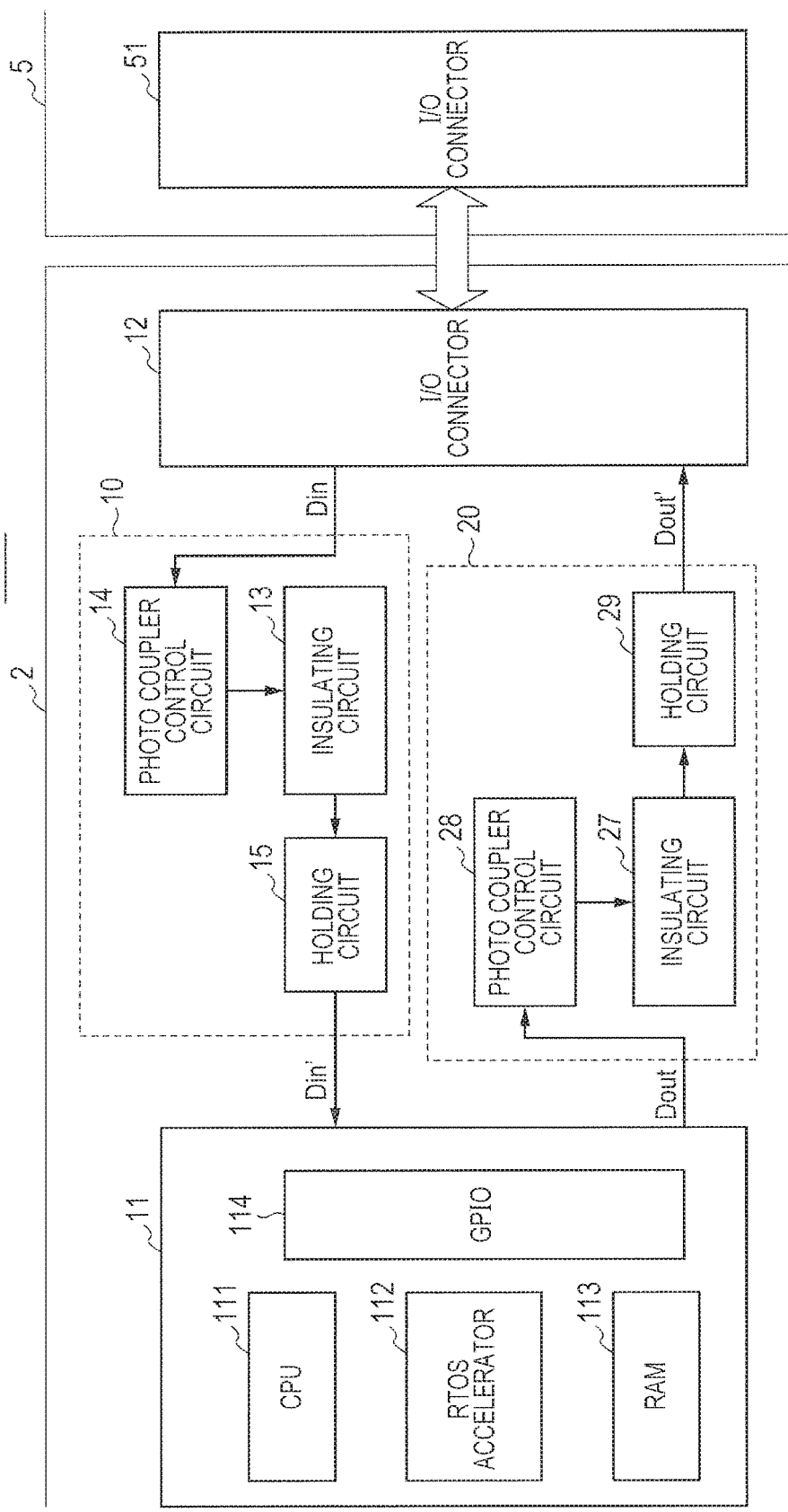
FIG. 10 is a block diagram showing a constitutional example of a semiconductor system with a semiconductor device according to a second embodiment mounted there.

FIG. 10 is a block diagram showing a constitutional example of a semiconductor system SYS2 with a semiconductor device 2 according to a second embodiment mounted there. The semiconductor device 2 drives not only the insulating circuit on the receiving side in the case of detecting a change of the input signal supplied from the external device but also the insulating circuit on the transmitting side in the case of detecting a change of the output signal generated by the internal circuit. According to this, it is possible to reduce the power consumed by not only the insulating circuit on the receiving side but also the insulating circuit on the transmitting side. Hereinafter, the details will be described.

The semiconductor system SYS2 includes the semiconductor device 2 and the external device 5. Differently from the semiconductor device 1, the semiconductor device 2 has an insulating signal transmission circuit 20, instead of the insulating circuit 17 provided on the transmission path. The insulating signal transmission circuit 20 includes an insulating circuit 27, a photo coupler control circuit 28, and a holding circuit 29. The other components of the semiconductor device 2 are the same as those of the semiconductor device 1; therefore, their description is omitted.

In the insulating signal transmission circuit 20, when detecting a change of the logic level of the output signal Dout, the photo coupler control circuit 28 supplies the power supply voltage VDD2 to the insulating circuit 27 for a predetermined period. The insulating circuit 27 is driven when the photo coupler control circuit 28 supplies the power supply voltage VDD2, to transmit the change of the output signal Dout generated by the internal circuit 11 (in short, the pulse signal indicating the change of the output signal Dout) from the signal path where the power supply voltage VDD2 is supplied to another signal path where the power supply voltage VDD1 is supplied. Here, the predetermined period indicates a period long enough for the insulating circuit 27 to transmit the change of the output signal Dout from one signal path to the other signal path. The holding circuit 29 generates the output reproducing signal Dout' as a reproducing signal of the output signal Dout, according to the change of the output signal Dout transmitted by the insulating circuit 27. The output reproducing signal Dout' generated by the holding circuit 29 is output to the outside through the I/O connector 12. Here, the insulating signal transmission circuit 20 drives the insulating circuit 27 only in the case of detecting the change of the output signal Dout; therefore, the power consumed by the insulating circuit 27 can be reduced.

(Constitutional Example of Insulating Signal Transmission Circuit 20)

Figure 11:
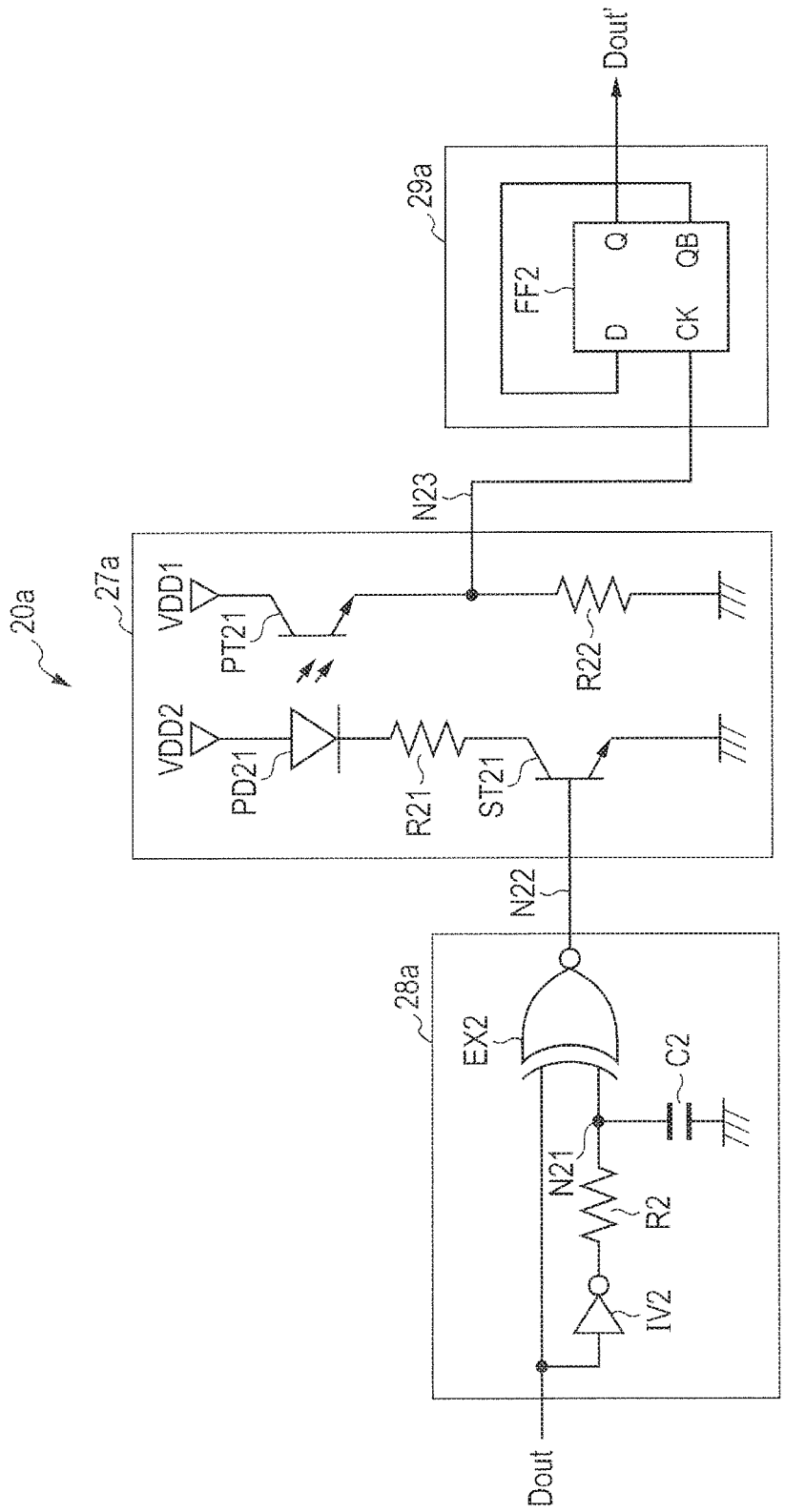
FIG. 11 is a view concretely showing a constitutional example of an insulating signal transmission circuit on a transmitting side provided in the semiconductor device shown in FIG. 10.

FIG. 11 is a view concretely showing a constitutional example of the insulating signal transmission circuit 20 as an insulating signal transmission circuit 20a. In the example of FIG. 11, the insulating circuit 27, the photo coupler control circuit 28, and the holding circuit 29 forming the insulating signal transmission circuit are respectively shown as an insulating circuit 27a, a photo coupler control circuit 28a, and a holding circuit 29a in the insulating signal transmission circuit 20a.

The photo coupler control circuit 28a includes an inverter IV2, a resistance element R2, a capacity element C2, and an exclusive NOR circuit (referred to as XNOR circuit) EX2. The inverter IV2 outputs an inversion signal of the output signal Dout. Here, the output signal of the inverter IV2 (the voltage level of the node N21) changes in delay with the time corresponding to the time constant determined by the resistance value of the resistance element R2 and the capacity value of the capacity element C2, from the change of the output signal Dout. The XNOR circuit EX2 outputs an exclusive NOR of the output signal Dout and a signal obtained by delaying the inversion signal of the output signal Dout (the voltage of the node N21). In short, when detecting a change of the output signal Dout, the photo coupler control circuit 28a turns its output signal active (H level) for a predetermined period. In other words, the photo coupler control circuit 28a generates pulse in its output signal when detecting a change of the output signal Dout.

The insulating circuit 27a is, for example, the photo coupler, including a light emitting diode PD21, a photo transistor PT21, resistance elements R21 and R22, and a switching transistor ST21.

The light emitting diode PD21, the resistance element R21, and the switching transistor ST21 are provided in series in the signal path (third signal path) between the power supply voltage terminal VDD2 and the ground voltage terminal GND. Current flowing between the collector and the emitter of the switching transistor ST21 is controlled by the output signal (the current of the node N22) of the photo coupler control circuit 28a. Specifically, during the period when the output signal of the photo coupler control circuit 28a is active (H level) after detecting the change of the output signal Dout, current flows between the collector and the emitter of the switching transistor ST21, and otherwise, current does not flow. The light emitting diode PD21 emits light during the period of current flowing there after turning on the switching transistor ST21.

The photo transistor PT21 and the resistance element R21 are provided in series, in another signal path (fourth signal path) insulated from the third signal path, between the power supply voltage terminal VDD1 and the ground voltage terminal GND. When the light emitting diode PD21 emits light, current flows between the collector and the emitter of the photo transistor PT21. Since current flows also in the resistance element R22, the voltage of the node N23 between the photo transistor PT21 and the resistance element R22 indicates the power supply voltage VDD1 level (H level). On the contrary, when the light emitting diode PD21 does not emit light, current does not flow between the collector and the emitter of the photo transistor PT21. Since current does not flow to the resistance element R22, the voltage of the node N23 indicates the ground voltage level (L level). In short, the voltage of the node N22 is transmitted to the node N23 through the insulating circuit 27a. The voltage of the node N23 is output as the output signal of the insulating circuit 27a.

The holding circuit 29a includes, for example, a flip-flop FF2. The input terminal D of the flip-flop FF2 is pulled up in the inside and set at the power supply voltage VDD1 level (H level) at the power on. Then, the flip-flop FF2 takes in and outputs the inversion signal QB of the output signal Q of the flip-flop FF2 in synchronization with a rise of the output signal (the voltage of the node N23) of the insulating circuit 27a. In other words, the flip-flop FF2 inverts the output signal Q in synchronization with a rise of the output signal of the insulating circuit 27a. The holding circuit 29a outputs the output signal Q of the flip-flop FF2 to the outside as the reproducing signal Dout' of the output signal Dout.

The insulating signal transmission circuit 20 is not restricted to the structure of the insulating signal transmission circuit 20a shown in FIG. 11 but may be the circuit structure (insulating signal transmission circuit 20b), for example, corresponding to the insulating signal transmission circuit 10b as the second constitutional example of the insulating signal transmission circuit 10.

(Flow Chart)

Figure 12:
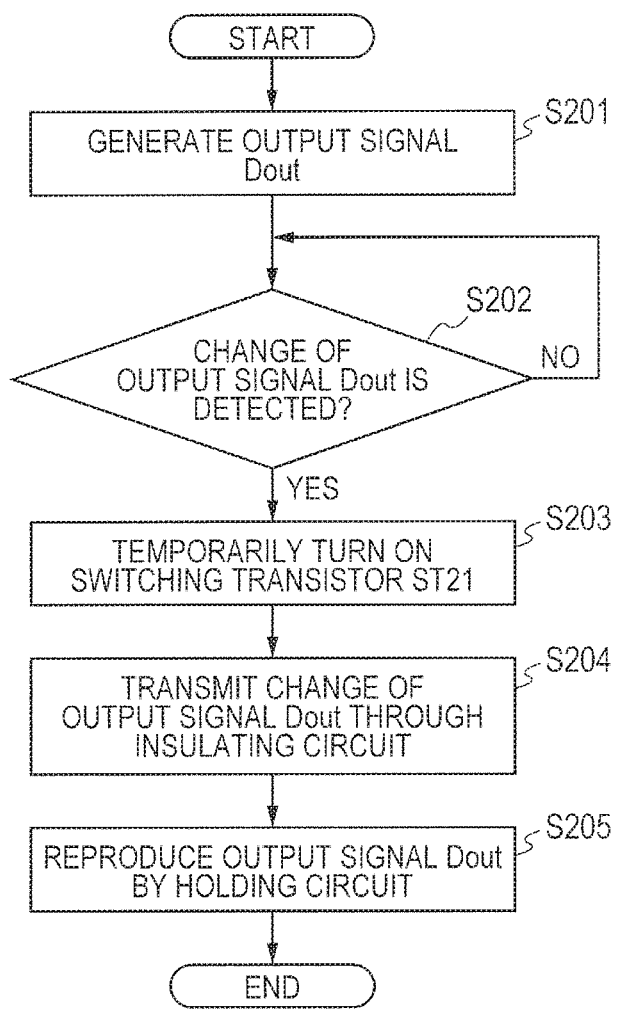
FIG. 12 is a flow chart showing a transmitting operation of the semiconductor device using the insulating signal transmission circuit shown in FIG. 11.

Continuously, a transmitting operation of the semiconductor device 2 will be described using FIG. 12. FIG. 12 is a flow chart showing the transmitting operation of the semiconductor device 2.

In the example of FIG. 12, at first, the internal circuit 11 generates the output signal Dout (Step S201). When the logic level of the output signal Dout does not change (NO in Step S202), the insulating signal transmission circuit 20 does not operate because the switching transistor ST21 is not turned on. On the contrary, when detecting a change of the logic level of the output signal Dout (YES in Step S202), the insulating signal transmission circuit 20 operates for a predetermined period because the switching transistor ST21 is turned on for the same period (Step S203). According to this, the change of the output signal Dout (in short, the pulse signal indicating the change of the output signal Dout) is transmitted from the signal path where the power supply voltage VDD2 is supplied to the other signal path where the power supply voltage VDD1 is supplied, through the insulating circuit 27 (Step S204). The holding circuit 29 generates the output reproducing signal Dout' as the reproducing signal of the output signal Dout, according to the change of the output signal Dout transmitted through the insulating circuit 27 (Step S205). The output reproducing signal Dout' generated by the holding circuit 29 is output to the outside through the I/O connector 12.

As mentioned above, the semiconductor device 2 and the semiconductor system SYS2 having the same according to the embodiment drive not only the insulating circuit 13 on the receiving side just when detecting a change of the input signal Din but also the insulating circuit 27 on the transmitting side just when detecting a change of the output signal Dout. Thus, the power consumed not only by the insulating circuit 13 on the receiving side but also the insulating circuit 27 on the transmitting side can be reduced.

Continuously, a modified example of the semiconductor system SYS2 will be described using FIGS. 13 to 15.

(First Modified Example of Semiconductor System SYS2)

Figure 13:
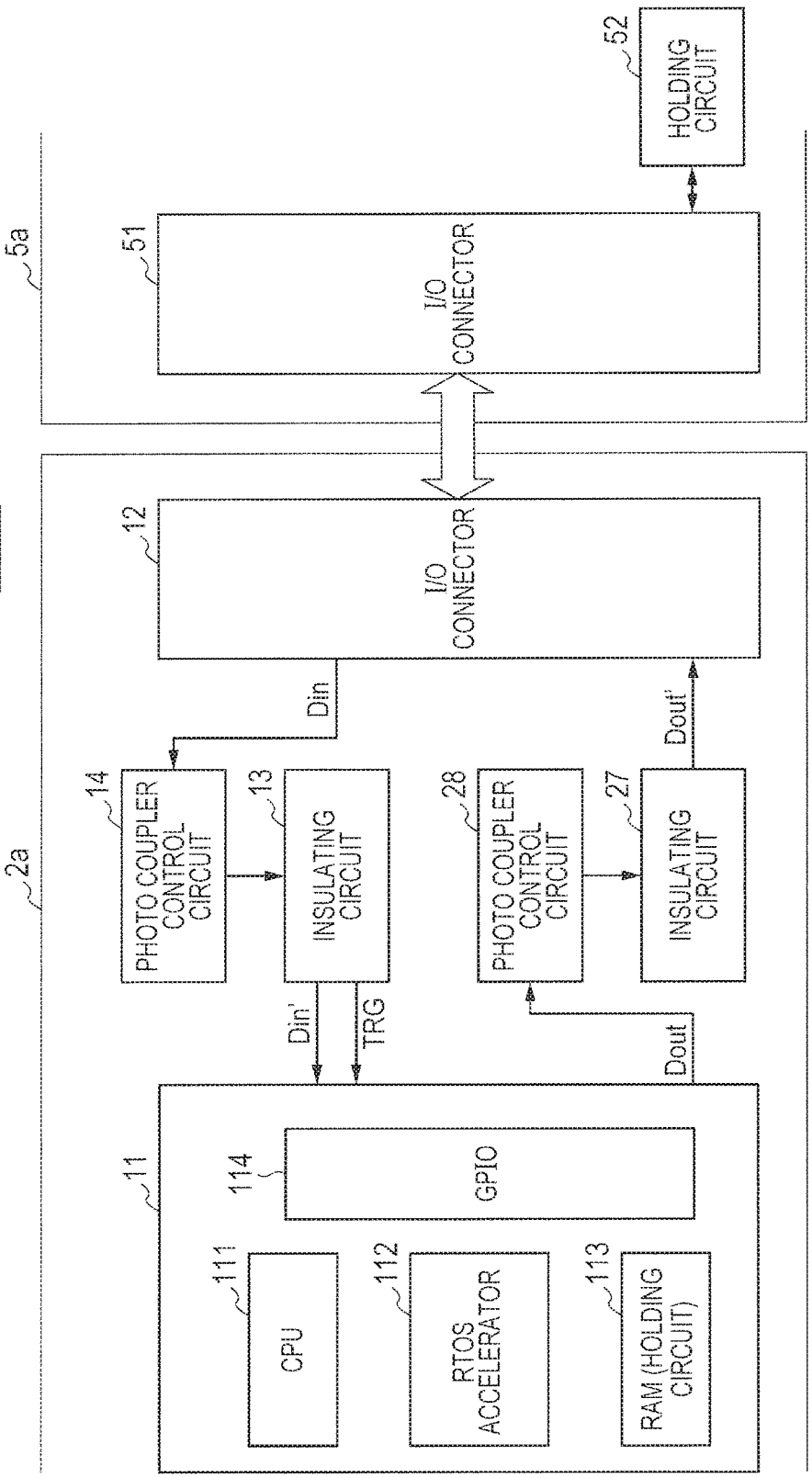
FIG. 13 is a block diagram showing a first modified example of the semiconductor device and the semiconductor system having the same shown in FIG. 10.

FIG. 13 is a block diagram showing a first modified example of the semiconductor system SYS2 as a semiconductor system SYS2a.

The semiconductor system SYS2a includes a semiconductor device 2a and an external device 5a. The semiconductor device 2a uses a part of the RAM 113 provided in the internal circuit 11, instead of the holding circuit 15 in the semiconductor device 2. Further, the semiconductor device 2a uses a holding circuit 52 provided in the external device 5a, instead of the holding circuit 29 in the semiconductor device 2. The holding circuit 52 provided in the external device 5a may be, for example, RAM. The other components of the semiconductor device 2a are the same as those of the semiconductor device 2; therefore, their description is omitted.

The semiconductor device 2a and the semiconductor system SYS2a having the same also can achieve the same effects as the semiconductor device 2 and the semiconductor system SYS2 having the same. Further, the semiconductor device 2a and the semiconductor system SYS2a can reduce the circuit size because it is not necessary to provide the holding circuits 15 and 29.

(Second Modified Example of Semiconductor System SYS2)

Figure 14:
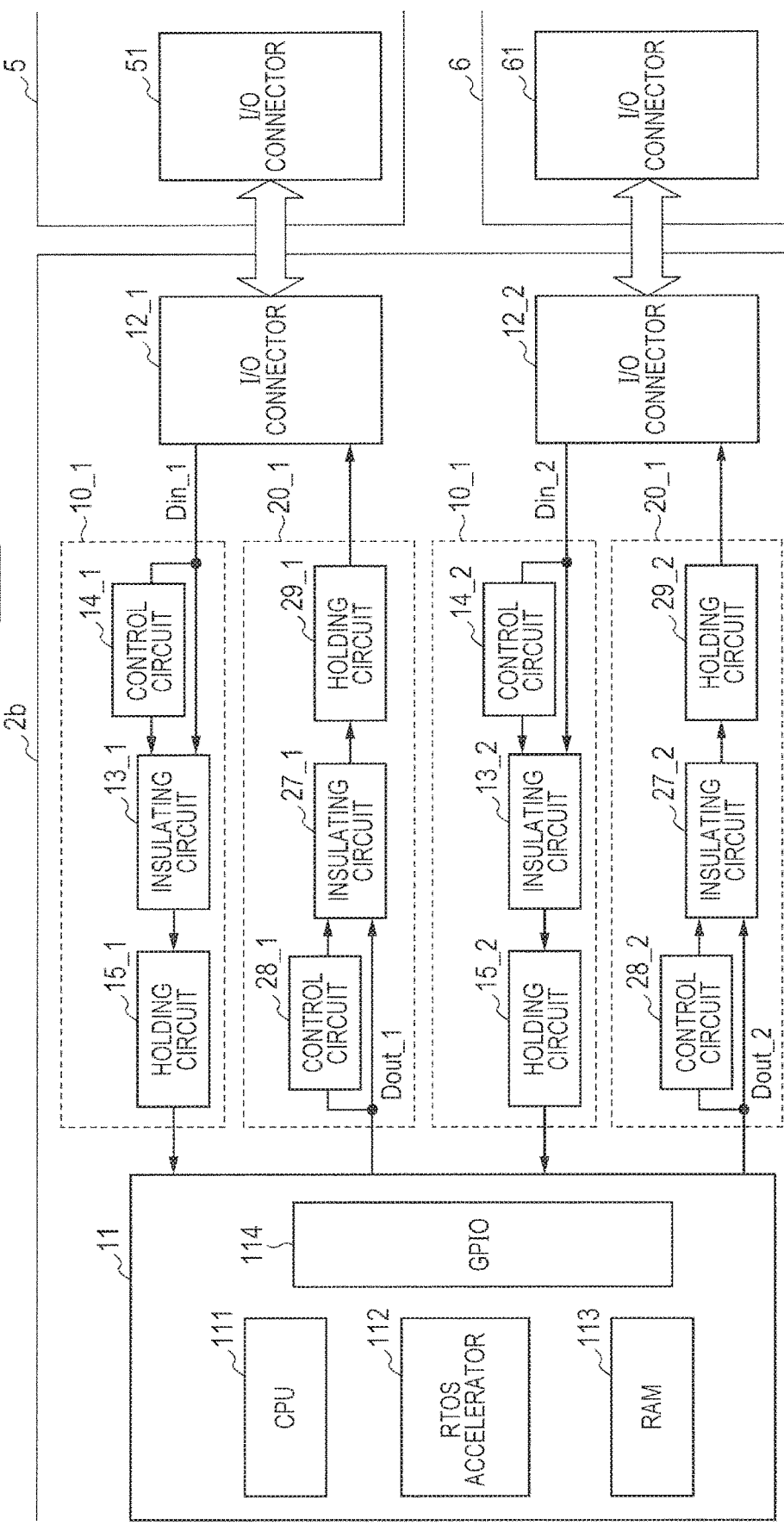
FIG. 14 is a block diagram showing a second modified example of the semiconductor device and the semiconductor system having the same shown in FIG. 10.

FIG. 14 is a block diagram showing a second modified example of the semiconductor system SYS2 as a semiconductor system SYS2b. The semiconductor system SYS2 is provided with one external device 5. On the contrary, the semiconductor system SYS2c is provided with two external devices 5 and 6. The details will be described below.

The semiconductor system SYS2b includes a semiconductor device 2b and the external devices 5 and 6. The semiconductor device 2b includes insulating signal transmission circuits 20_1 and 20_2, respectively instead of the insulating circuits 17_1 and 17_2, compared with the semiconductor device 1b.

The insulating signal transmission circuit 20_1 has the same circuit structure, for example, as the insulating signal transmission circuit 20b and transmits the output signal Dout_1 generated by the internal circuit 11 to another signal path insulated form the signal path of the above output signal Dout_1 as the output reproducing signal Dout_1', with the internal circuit 11 insulated from the external device 5. The output reproducing signal Dout_1' transmitted to the other signal path through the insulating signal transmission circuit 20_1 is output to the external device 5. Here, the trigger signal TRG (the pulse signal indicating the change of the output signal Dout_1) is to be generated within the insulating signal transmission circuit 20_1. The insulating signal transmission circuit 20_2 has the same circuit structure, for example, as the insulating signal transmission circuit 20b and transmits the output signal Dout_2 generated by the internal circuit 11 to the other signal path insulated from the signal path of the above output signal Dout_2 as an output reproducing signal Dout_2', with the internal circuit 11 insulated from the external device 6. The output reproducing signal Dout_2' transmitted to the other signal path through the insulating signal transmission circuit 20_2 is output to the external device 6. Here, the trigger signal TRG (the pulse signal indicating the change of the output signal Dout_2) is to be generated within the insulating signal transmission circuit 20_2.

The other components of the semiconductor device 2b are the same as those of the semiconductor device 1b; therefore, their description is omitted.

The semiconductor device 2b and the semiconductor system SYS2b having the same also can achieve the same effects as the semiconductor device 1b and the semiconductor system SYS1b having the same. Further, in the semiconductor device 2b and the semiconductor system SYS2b having the same, the insulating signal transmission circuit 20_1 drives the insulating circuit 27_1 only in the case of detecting a change of the output signal Dout_1, hence to reduce the power consumed by the insulating circuit 27_1. Further, the insulating signal transmission circuit 20_2 drives the insulating circuit 27_2 only when detecting a change of the output signal Dout_2, hence to reduce the power consumed by the insulating circuit 27_2.

In the example of FIG. 14, the case of providing two external devices 5 and 6 has been described; however, the invention is not restricted to this but three and more external devices may be provided to transfer signals to and from the semiconductor device 2b.

(Three Modified Example of Semiconductor System SYS2)

Figure 15:
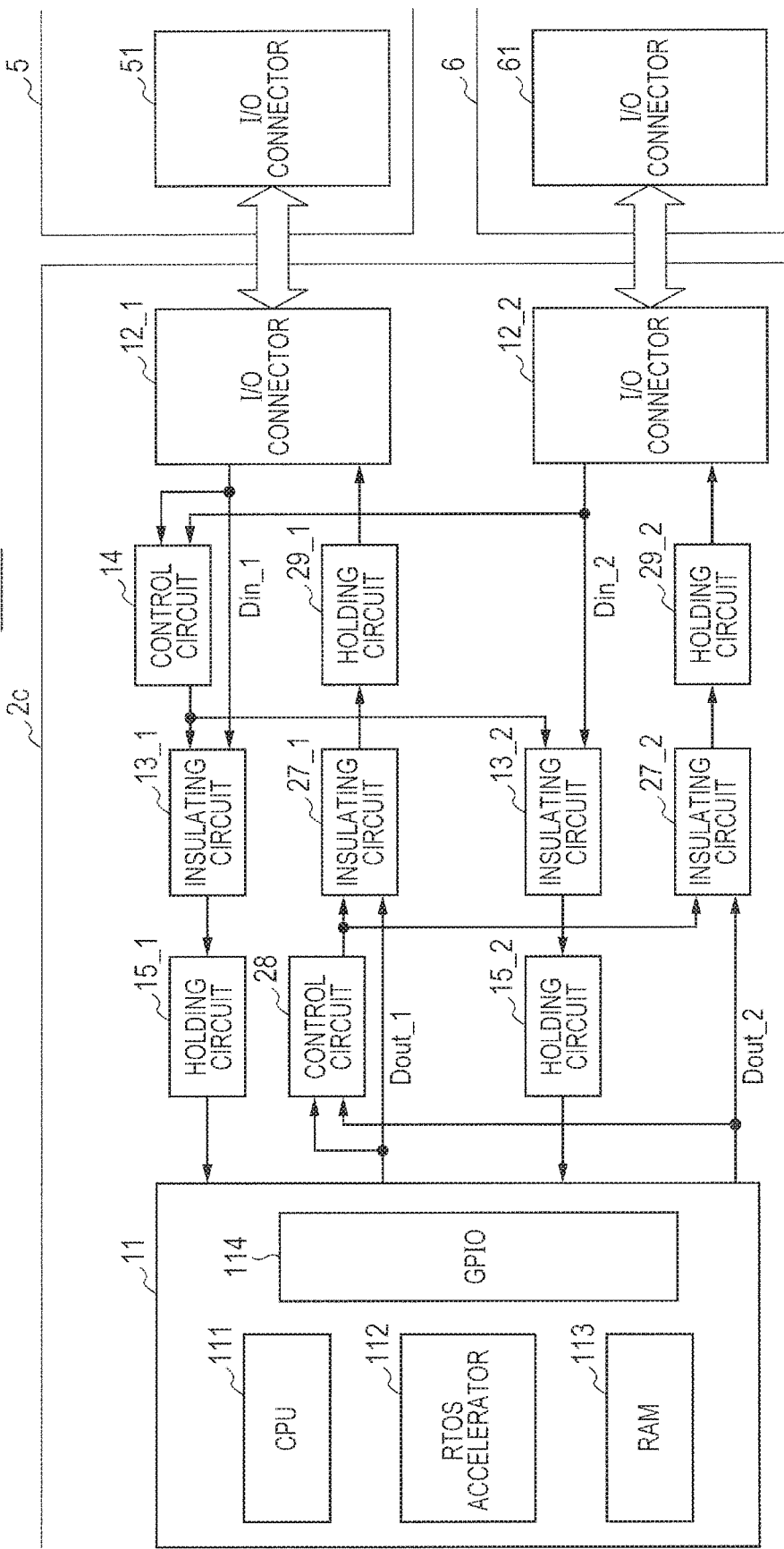
FIG. 15 is a block diagram showing a third modified example of the semiconductor device and the semiconductor system having the same shown in FIG. 10.

FIG. 15 is a block diagram showing a third modified example of the semiconductor system SYS2 as a semiconductor system SYS2c.

The semiconductor system SYS2c includes a semiconductor device 2c and the external devices 5 and 6. The semiconductor device 2c includes one photo coupler control circuit 14 shared for two receiving paths, instead of the two photo coupler control circuits 14_1 and 14_2 respectively provided in the two receiving paths in the semiconductor device 2b. Further, the semiconductor device 2c includes one photo coupler control circuit 28 shared for two transmitting paths, instead of the two photo coupler control circuits 28_1 and 28_2 respectively provided in the two transmitting paths in the semiconductor device 2b. The other components of the semiconductor device 2c are the same as those of the semiconductor device 2b; therefore, their description is omitted.

The semiconductor device 2c and the semiconductor system SYS2c having the same also can achieve the same effects as the semiconductor device 1c and the semiconductor system SYS1c having the same. Further, the semiconductor device 2c and the semiconductor system SYS2c having the same drive the insulating circuits 27_1 and 27_2 only when detecting some change of the output signals Dout_1 and Dout_2, hence to reduce the power consumed by the insulating circuits 27_1 and 27_2. The semiconductor device 2c and the semiconductor system SYS2c having the same are inferior to the semiconductor device 2b and the semiconductor system SYS2b having the same in reducing the power consumption; however, they can reduce the number of the photo coupler control circuits, hence to suppress an increase in the circuit size.

Third Embodiment

Figure 16:
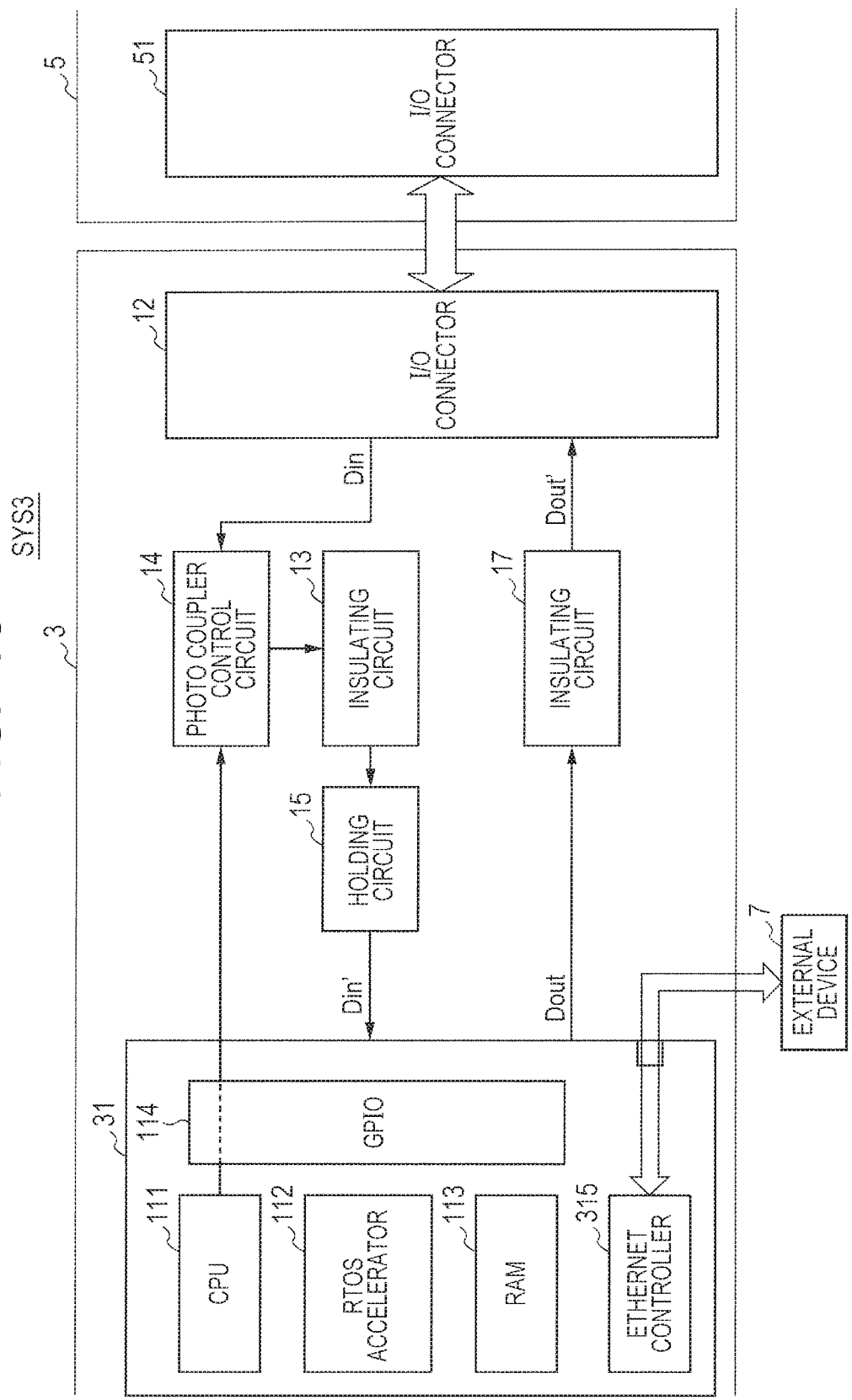
FIG. 16 is a block diagram showing a constitutional example of a semiconductor system with a semiconductor device according to a third embodiment mounted there.

FIG. 16 is a block diagram showing the constitutional example of a semiconductor system SYS3 with a semiconductor device 3 according to a third embodiment mounted there.

As shown in FIG. 16, the semiconductor system SYS3 includes a semiconductor device 3 and the external devices 5 and 7. The external device 5 is, for example, various types of sensors or a remote I/O. The external device 7 is a device on the Ethernet (registered trademark), so that the semiconductor device 3 performs the Ethernet communication with the external device 7, based on the input signal Din received from the external device 5 through the insulating circuit. Specifically, the semiconductor device 3 includes an internal circuit 31, instead of the internal circuit 11 in the semiconductor device 1. The internal circuit 31 further includes an Ethernet controller 31S, compared with the internal circuit 11.

The Ethernet controller 31S transmits the processing result of the CPU 111 to a device on the Ethernet through the Ethernet communication and receives data from a device on the Ethernet through the Ethernet communication.

The external device 7 is, for example, a host device, which has a function of determining whether or not the internal circuit 31 has to receive the input signal Din. Upon receipt of an instruction to the effect that the internal circuit 31 has no need to receive the input signal Din from the external device 7 as the host device, the Ethernet controller 31S transmits the above instruction to the CPU 111. The CPU 111 stops the driving of the insulating circuit 13 by the photo coupler control circuit 14, regardless of a change of the input signal Din. Therefore, the input signal Din is not transmitted to the internal circuit 31 from the external device 5 through the insulating circuit 13.

The other components of the semiconductor device 3 and the operation of the semiconductor device 3 in the case of obtaining the instruction to the effect that the entry of the input signal Din is necessary from the host device are the same as those of the semiconductor device 1; their description is omitted.

As mentioned above, the semiconductor device 3 and the semiconductor system SYS3 according to the embodiment obtain the information to the effect that the input signal Din transmitted is not necessary from the host device, through the Ethernet communication. Based on the obtained information, they control whether or not the insulating circuit 13 is driven. The semiconductor device 3 and the semiconductor system SYS3 according to the embodiment can avoid the insulating circuit 13 from driving when the input signal Din is not necessary, hence to reduce the power consumed by the insulating circuit 13.

The external device of performing the Ethernet communication with the semiconductor device 3 is not restricted to the host device but it may be any other device than this.

As mentioned above, the semiconductor device and the semiconductor system having the same according to the first to third embodiments drive the insulating circuit only when detecting a change of the input signal Din, hence to reduce the power consumed by the insulating circuit.

As set forth hereinabove, the invention made by the inventor et al. has been described specifically based on the embodiments; the invention is not restricted to the above mentioned embodiments but needless to say, various modifications are possible without departing from the its spirit.

For example, the conductivity type (p-type or n-type) of a semiconductor substrate, a semiconductor layer, a diffusion layer (diffused area), and the like may be converted in the structure of the semiconductor device according to the embodiments. Therefore, when one conductivity type of the n-type and the p-type is defined as a first conductivity type and the other is defined as a second conductivity type, the first conductivity type can be the p-type and the second conductivity type can be the n-type or the first conductivity type can be the n-type and the second conductivity type can be the p-type.

What is claimed is:

1. A semiconductor device comprising:
a first control circuit that passes a current to a first signal path of a first power system for a predetermined period when detecting a change of a first input signal supplied from outside;
a first insulating unit that transmits a first pulse signal indicating the change of the first input signal, from the first signal path to a second signal path of a second power system insulated from the first signal path, according to a current flow to the first signal path;
a first holding circuit that reproduces the first input signal from the first pulse signal transmitted to the second signal path by the first insulating unit;

a first internal circuit that receives the first input signal reproduced by the first holding circuit, a second control circuit that passes a current to a third signal path of the first power system for a predetermined period when detecting a change of a second input signal supplied from the outside;

a second insulating unit that transmits a second pulse signal indicating the change of the second input signal, from the third signal path to a fourth signal path of a second power system insulated from the third signal path, according to a current flow to the third signal path; and a second holding circuit that reproduces the second input signal from the second pulse signal transmitted to the fourth signal path by the second insulating unit, wherein the first internal circuit further receives the second input signal reproduced by the second holding circuit.

2. The device according to claim 1, wherein the first insulating unit is a photo coupler.

3. The device according to claim 1, wherein the first internal circuit includes a writable memory circuit, and wherein the memory circuit is used as the first holding circuit.

4. The device according to claim 1, wherein the first control circuit is designed to pass a current to the first signal path and the third signal path of the first power system for a predetermined period when detecting the change of the second input signal supplied from the outside, in addition to when detecting the change of the first input signal.

5. A semiconductor system comprising:

the semiconductor device according to claim 1; and an external device that generates the first input signal and outputs the same to the semiconductor device.

6. A semiconductor system comprising:

the semiconductor device according to claim 1;

an external device that generates the first input signal and outputs the same to the semiconductor device; and a host device that performs Ethernet communication with the semiconductor device, wherein the semiconductor device stops a current supply to the first insulating unit by the first control circuit, regardless of whether or not the first input signal changes, when receiving an instruction to the effect that an input of the first input signal is not necessary from the host device.

7. The device according to claim 1, wherein the first insulating unit includes a switch that is provided on the first signal path and turned on for a predetermined period when the first control circuit detects a change of the first input signal, a light emitting diode that is provided on the first signal path in series with the switch and converts the current to light when a current flows to the first signal path by turning on the switch, a photo transistor that is provided on the second signal path and turned on when receiving the light of the light emitting diode, and a resistance element that converts the current flowing to the photo transistor into voltage and outputs the same as the first pulse signal.

8. The device according to claim 1, wherein the first insulating unit includes a first switch that is provided on the first signal path and turned on for the predetermined period when detecting the change of the first input signal, a first light emitting diode that is provided on the first signal path in series with the first switch and converts the current into light when the first switch is turned on and the first control circuit supplies a current to the first signal path for a predetermined period, a first photo transistor that is provided on the second signal path and turned on when receiving the light of the first light emitting diode, and a first resistance element that converts the current flowing to the first photo transistor into voltage and outputs the voltage as the first pulse signal, wherein the second insulating unit includes a second switch that is provided on the third signal path provided in parallel with the first signal path and turned on during a period when the first input signal indicates an H level, a second light emitting diode that is provided on the third signal path in series with the second switch and converts the current into light when the second switch is turned on and the first control circuit supplies a current to the third signal path for a predetermined period, a second photo transistor that is provided on the fourth signal path of the second power system and turned on when receiving the light of the second light emitting diode, and a second resistance element that converts the current flowing to the second photo transistor into voltage and outputs the voltage as a second pulse signal, and wherein the first holding circuit reproduces the first input signal by taking in the second pulse signal in synchronization with a rise of the first pulse signal.

9. A method of controlling a semiconductor device, the method comprising:

passing a current to a first signal path of a first power system for a predetermined period when detecting a change of a first input signal supplied from outside;

transmitting a first pulse signal indicating the change of the first input signal, from the first signal path to a second signal path of a second power system insulated from the signal path, according to a current flow to the first signal path;

reproducing the first input signal from the first pulse signal transmitted to the second signal path;

supplying the reproduced first input signal to a first internal circuit;

passing a current to a third signal path of a second power system for a predetermined period when detecting a change of an output signal generated by the first internal circuit;

transmitting a second pulse signal indicating the change of the output signal, from the third signal path to a fourth signal path of the first power system insulated from the third signal path, according to the current flow to the third signal path;

reproducing the output signal from the second pulse signal transmitted to the fourth signal path; and outputting the reproduced output signal.

10. A semiconductor device comprising:

a first control circuit that passes a current to a first signal path of a first power system for a predetermined period when detecting a change of a first input signal supplied from outside;

a first insulating unit that transmits a first pulse signal indicating the change of the first input signal, from the first signal path to a second signal path of a second power system insulated from the first signal path, according to a current flow to the first signal path;

a first holding circuit that reproduces the first input signal from the first pulse signal transmitted to the second signal path by the first insulating unit;

a first internal circuit that receives the first input signal reproduced by the first holding circuit;

a second control circuit that passes a current to a third signal path of a second power system for a predetermined period when detecting a change of an output signal generated by the first internal circuit; and a second insulating unit that transmits a second pulse signal indicating the change of the output signal, from the third signal path to a fourth signal path of the first power system insulated from the third signal path, according to a current flow to the third signal path, wherein the output signal is reproduced from the second pulse signal transmitted by the second insulating unit, by using a holding circuit provided in an external device.

11. A semiconductor system comprising:
the device according to claim 10; and
the external device.

* * * * *